United States Patent
Dinger

(10) Patent No.: US 8,253,927 B2
(45) Date of Patent: Aug. 28, 2012

(54) OPTICAL ELEMENT WITH MULTIPLE PRIMARY LIGHT SOURCES

(75) Inventor: Udo Dinger, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 546 days.

(21) Appl. No.: 12/470,092

(22) Filed: May 21, 2009

(65) Prior Publication Data

US 2009/0257040 A1 Oct. 15, 2009

Related U.S. Application Data

(63) Continuation of application No. PCT/EP2008/001278, filed on Feb. 19, 2008.

(60) Provisional application No. 60/902,234, filed on Feb. 20, 2007.

(30) Foreign Application Priority Data

Feb. 20, 2007 (DE) .......................... 10 2007 008 702

(51) Int. Cl.
*G03B 27/54* (2006.01)

(52) U.S. Cl. ............................................ 355/70; 355/46

(58) Field of Classification Search .................... 355/46, 355/70
See application file for complete search history.

(56) References Cited

U.S. PATENT DOCUMENTS

| | | | |
|---|---|---|---|
| 5,646,715 A * | 7/1997 | Wangler | 355/67 |
| 5,991,009 A * | 11/1999 | Nishi et al. | 355/70 |
| 6,233,039 B1 | 5/2001 | Yen et al. | |
| 6,353,470 B1 | 3/2002 | Dinger | |
| 6,438,139 B1 | 8/2002 | Huang et al. | |
| 6,438,199 B1 | 8/2002 | Schultz et al. | |
| 6,570,168 B1 | 5/2003 | Schultz et al. | |
| 6,861,656 B2 | 3/2005 | Murakami | |
| 7,015,489 B2 | 3/2006 | Singer et al. | |
| 7,061,582 B2 * | 6/2006 | Zinn et al. | 355/67 |
| 7,329,886 B2 * | 2/2008 | Singer et al. | 250/493.1 |
| 7,884,921 B2 * | 2/2011 | Noboru et al. | 355/67 |
| 2002/0154395 A1 | 10/2002 | Mann et al. | |
| 2004/0057120 A1 | 3/2004 | Olszak et al. | |
| 2004/0256575 A1 * | 12/2004 | Singer et al. | 250/492.2 |
| 2005/0253922 A1 | 11/2005 | Hashiguchi | |
| 2006/0091327 A1 | 5/2006 | Kroon | |
| 2006/0119824 A1 | 6/2006 | Dierichs | |
| 2006/0132747 A1 | 6/2006 | Singer et al. | |
| 2007/0165202 A1 * | 7/2007 | Koehler et al. | 355/67 |
| 2009/0257040 A1 * | 10/2009 | Dinger | 355/70 |

FOREIGN PATENT DOCUMENTS

| WO | WO 2004/010224 | 1/2004 |
|---|---|---|
| WO | WO 2006/064363 | 6/2006 |
| WO | WO 2006/074812 | 7/2006 |
| WO | WO 2007/002170 | 1/2007 |

* cited by examiner

*Primary Examiner* — Thomas R Artman

(74) *Attorney, Agent, or Firm* — Fish & Richardson P.C.

(57) ABSTRACT

The disclosure relates to an illumination system, such as an illumination system for use in microlithography. The illumination system can include an optical element with multiple primary light sources. The illumination system can illuminate a field in a field plane having a field contour. The illumination system can be configured so that each primary light source illuminates an area in the field plane that is smaller than a size of an area encircled by the field contour.

21 Claims, 17 Drawing Sheets

ILLUMINATION IN EXIT PUPIL PLANE

ILLUMINATION IN EXIT PUPIL PLANE

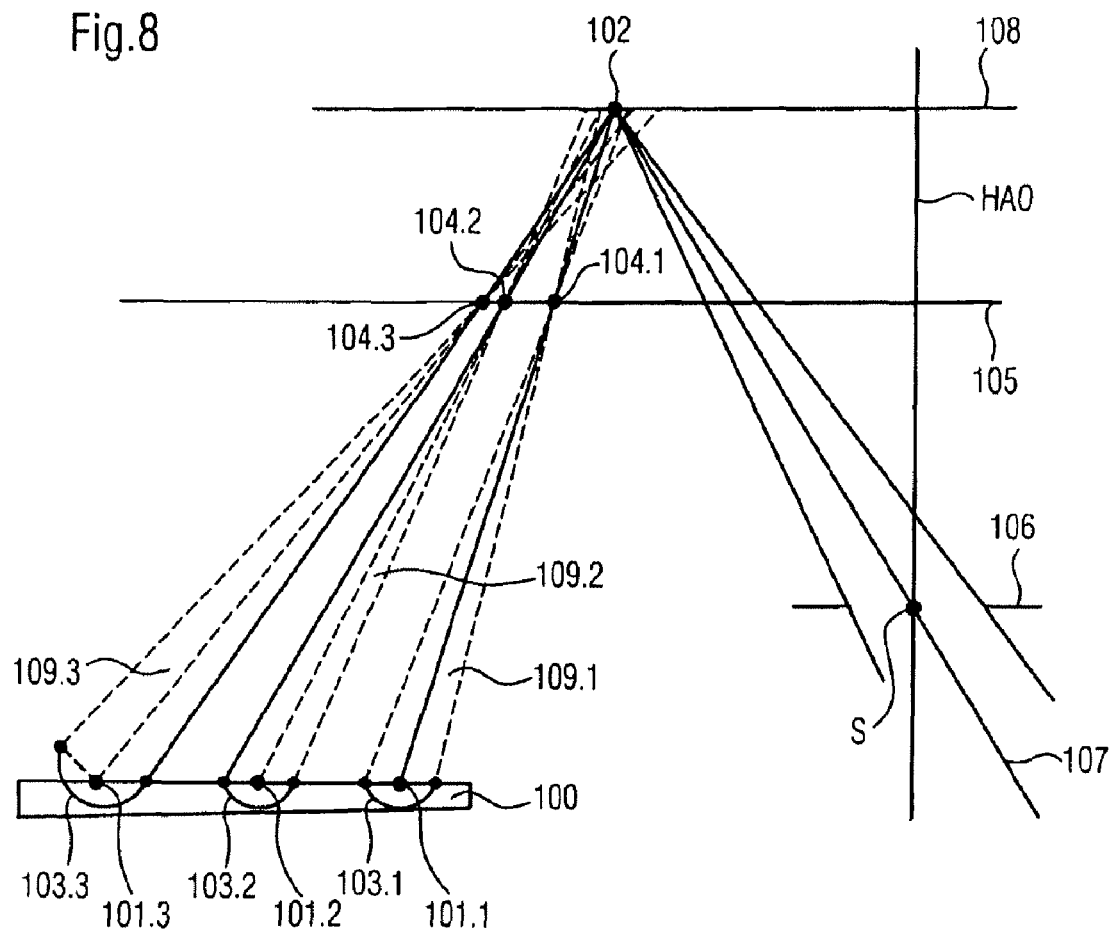

Fig.18A
Fig.18B
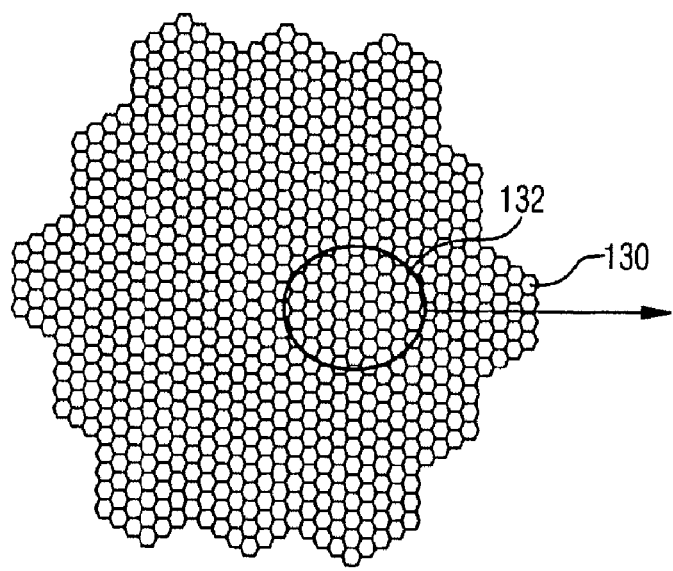
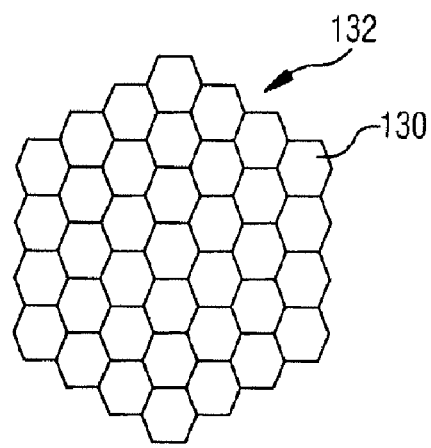

OPTICAL ELEMENT WITH MULTIPLE PRIMARY LIGHT SOURCES

CROSS-REFERENCE TO RELATED APPLICATIONS

This application is a continuation of, and claims benefit under 35 USC 120 to, international application PCT/EP2008/001278, filed Feb. 19, 2008, which claims benefit of German Application No. 10 2007 008 702.2, filed Feb. 20, 2007 and U.S. Ser. No. 60/902,234, filed Feb. 20, 2007. International application PCT/EP2008/001278 is hereby incorporated by reference in its entirety.

FIELD

The disclosure relates to an illumination system, such as an illumination system that can be used in microlithography, having an optical element with multiple primary light sources. The disclosure also relates to a microlithography projection system having such an illumination system and a corresponding method.

BACKGROUND

To help reduce the structure widths in electronic components, particularly into the submicron range, it can be desirable to reduce the wavelength of the light used in the microlithography process. Some lithography processes use wavelengths less than 193 nm, such as soft X-rays. Such lithography processes are commonly referred to as EUV lithography.

SUMMARY

In some embodiments, the disclosure provides a relatively efficient illumination system for microlithography with soft X-rays.

In certain embodiments, an illumination system includes an optical element having multiple primary light sources. The illumination system can illuminate a field in a field plane having a field contour. The illumination system is configured in so that each of the primary light sources illuminates only an area in the field plane having a dimension smaller than the field contour. This means that the size of the area illuminated by each of the light sources is smaller than the area encircled by the field contour in the field plane. If the area in the field plane which is encircled by the field contour is for example rectangular and has a size or a dimension of 26 mm×2 mm=52 mm$^2$ and for example the illuminated area of the light source in the field plane is a circle with a radius r=0.5 mm, then the size of the illuminated area by the primary light source in the field plane can be $\pi r^2 = 0.785$ mm$^2$, which is about 1/60 of the size of the field encircled by the field contour in the field plane.

The area, which is encircled by the field contour is also denoted as a field which is illuminated in the field plane. The form of the field can be of any shape, such as rectangular as described above or alternatively arc-shaped.

Also the form of the area illuminated by each of the light sources can be of any shape. For example the area can be circular. Alternatively the area can be of elliptical shape.

The area illuminated by different light sources of the multiple of light sources in the field plane can also be of different size. For example, one light source of the multiple of light sources can illuminate a circular area having a first size. Another light source of the multiple of light sources can illuminate an elliptical area having a second size, which is different from the first size.

The size of the area illuminated by one of the light sources in the field plane is smaller than the size of the field defined by the field contour. For example, the size of the area illuminated by each of the light sources in the field plane can be less than 1/10 (e.g., less than 1/50) the size of the field plane. In some embodiments, the size of the area illuminated by one of the multiple of light sources can be less than 1/100 (e.g., less than 1/1000) the size of the field defined by the field contour.

In the optical element with multiple primary light sources, the arrangement of the primary light sources and the respective radiation output characteristics of each light source can be such that each of the multitude of primary light sources illuminates an area in the field plane of the illumination system directly or with the help of further optical components, whereby through the combined areas of each light source in the field plane, the field, which is also referred to as object field, is illuminated in a specific shape, for example a segment of a ring.

In some embodiments, a field plane with a specific field contour can be illuminated using the light of multiple primary light sources with a small number of reflections of two or fewer a field in. Furthermore a pupil illumination can, for example, be set up by simply switching on or switching off specific primary light sources of the optical element with multiple primary light sources.

It can be envisioned that the radiation output characteristic, such as the angle of deflection of the light rays emitted by the primary light source, is set by reflective optical components, such as reflective surfaces, which are assigned to each primary light source. This means that one reflective surface, e.g., one micro-collector, is assigned to each light source of the multi-source array. Depending on how the reflective surface is configured, such as how it is positioned relative to the primary light source, different discrete areas in the field plane can be illuminated.

A multi-source array with multiple primary light sources can have an arrangement of the primary light sources in regular columns and rows. The cross-correlation between one primary light source and one reflective area, such as a collector, can also be realized in a fixed unit, which is referred to as a light source unit.

Optionally, the multiple light sources can be held, for example, in columns and rows in a first carrier element and the respective reflective areas or collectors assigned to the light sources can be held in a second carrier element. By shifting and/or tilting the first carrier element with multiple light sources and/or the second carrier element with multiple collectors, it can be possible to change the direction of the light bundles which originate from a current combination of primary light sources and collectors, and thereby to illuminate specific areas in the field plane. This can make it possible, for example, to influence the uniformity of the illumination in the field plane.

In certain embodiments, tilting and/or shifting the first carrier element with multiple of light sources and/or the second carrier element with multiple of collectors relative to each other can influence the pupil illumination in the exit pupil of the illumination system. By tilting and shifting the direction of the light bundle originating from a combination of a light source and a collector can be changed. It is also possible that a larger number of light sources are present than are desirable for a specific pupil illumination. It can be desirable in such a case if at least a part of the multiple primary light sources are responsive to direct control to allow the setting of different pupil illuminations, also referred to as pupil settings, for example a dipolar, quadrupolar or circular illumination or an annular illumination. In this way, if a sufficient quantity of primary light sources is available in the multi-source array, the setting can be selected simply by turning the respective primary light sources on or off which are assigned to the selected setting. Another possibility for selecting the setting presents itself, if the adjustment of the setting is not made by switching the primary light sources on and off, but by tilting and/or shifting of the reflective areas or collectors.

assigned to the respective primary light source unit. The tilting and/or shifting allows not only the shape of the illumination, i.e. the setting, to be influenced, but also for example the telecenthcity of the pupil illumination. The so-called telecentricity error of the pupil illumination means the deviation of the energy-weighted central ray from the geometric principal ray in a field point. The geometric principal ray in a field point in the object plane of the projection objective is defined by the line connecting the field point to the center of the entry pupil of the projection objective. It is of course possible to combine the switching-on and switching-off of specific primary light sources with the shifting and/or tilting.

In some embodiments, the primary light sources can be configured, for example, as semiconductor laser diodes. Such laser diodes (LEDs) emit light radiation of a wavelength of for example 400 nm. Laser diodes for use in microlithography are disclosed, for example, in U.S. Pat. No. 6,233,039.

For illumination with light of a usable wavelength smaller than 100 nm, for example EUV radiation with wavelengths in the range from 8 to 20 nm, such as 13.5 nm, so-called pinch plasma sources can be used as primary light sources. Sources of this type are disclosed in WO 2007/002170.

The primary light sources can emit a usable radiation in the range of wavelengths shorter than or equal to 100 nm, such as in the range of so-called EUV radiation with wavelengths between 5 nm and 20 nm.

For the formation of multiple images of a primary light source in a plane, the reflective surface can have positive optical power and therefore a collecting effect. The size of the illumination spots or the images of the primary light sources in case of a critical illumination in the plane in which the field is formed can be small in relation to the field to be illuminated. For the special case of a critical illumination the light source images can be formed in a field plane of the illumination system.

In the field plane, then the so-called illumination spots or light source images are superimposed on each other, which produce a ring-shaped illumination of the desired area. By changing the orientation of the reflective surfaces with optical power in relation to the respective light sources from which the light is received, it is possible to illuminate different areas in the field plane by changing the position of the reflective surfaces in relation to the primary light sources.

To illuminate different areas in the field plane by the images of the primary light sources it is possible to change the position of the reflective surfaces in relation to the primary light sources by moving and/or tilting the light source. Optionally, the reflective surface could be moved and/or tilted. In some embodiments, the reflective surface as well as the light source could be moved and/or tilted.

Besides different areas in the field plane, an area of the exit pupil of the illumination system is also being illuminated by the light of the primary light source. In the exit pupil also different areas for different light sources are illuminated. The area illuminated by a light source in the exit pupil is smaller than the area encircled by an exit pupil contour.

The exit pupil of the illumination system is defined by the crossing point of the chief-rays associated to each field point in the field plane. In a projection exposure system the exit pupil of the illumination system corresponds to the entrance pupil of a subsequent projection objective. If the projection objective is a rotational symmetric system around an axis of rotation then the crossing point of the chief ray to the central field point with the optical axis of the illumination system determines the exit pupil plane. The exit pupil plane in such a system is the plane on which the optical axis of the projection objective stands perpendicular. For the special case of a Koehler illumination images of the light sources are formed in the exit pupil plane.

The individual primary light sources and the reflective surfaces, such as the micro-collectors, assigned to them are arranged so that substantially a ring field segment is illuminated in the field plane. With an appropriate arrangement of the primary light sources, the illumination of the exit pupil can take on any desired shape, such as a circular or a bipolar or quadrupolar outside contour, i.e. a circular or a bipolar or quadrupolar setting.

In some embodiments, it is possible to change the illumination of the pupil, i.e. the setting in the pupil, without the need to mechanically change the positions of reflective surfaces or collector surfaces. This is possible, for example, by providing appropriate light sources for each setting. To change the setting can involve only switching individual primary light sources on or off as needed for the desired setting.

The disclosure can provide a way to achieve a significantly faster change of the pupil illumination.

In certain embodiments, the disclosure provide an illumination system with an optical element having a plurality of facets. A light source may be associated with each facet. For example, US 2006/0132747 discloses an illumination system in which each individual facet of the facetted optical element could be illuminated by separate light source.

The light source array generally has between 100 and 100,000 primary light sources set up in a regular arrangement, which provide the radiation, specifically in the EUV range of wavelengths. Sources of this kind can have a source size in the range from 0.1 µm to 40,000 µm and can be complemented by an array of reflective surfaces, so-called micro-collectors, which can be produced, for example, through microstructure techniques and which are individually assigned to each primary light source.

The primary light sources are often set up in a regular arrangement, but it may be desirable to achieve a ring-shaped illumination in the field plane. Accordingly, in some embodiments, the disclosure provides light sources arranged in a regular array that are controlled so that a kidney-shaped outside contour is obtained as a result.

In some embodiments, the disclosure provides an illumination such that the field in the field plane as well as the exit pupil are illuminated by the optical element itself with multiple primary light sources (a so-called multi-source array) without reflection on a facetted mirror. The efficiency of such a system can be increased by 30 to 40 percent in comparison to a system having a facetted mirror. A system of this kind can have, for example, only a single reflective optical element. Such a single optical element could be a collector. A reflector surface of a collector is assigned to a respective primary light source for light traveling from the light source array to the field plane of the illumination system. It is possible to design collectors with more than one reflection. An example of this is a collector which is designed as a so-called Wolter collector. In a collector of this type, two reflections occur at the reflector surfaces of the collector.

An illumination system with a multi-source array and with collectors that are assigned to the primary light sources can have no further optical component arranged in the light path from the optical element with multiple primary light sources to a field plane of the illumination system.

If the optical element with multiple primary light sources is laid out as a multi-source array with a regular arrangement of the primary light sources in columns and rows, it can be possible (e.g., as an alternative to the switching-off of light sources) to shape the ring field by way of an optical component that is arranged in the light path between the primary light source and the field plane. This field-shaping component can for example be a grazing-incidence mirror, such as a convex grazing-incidence mirror.

Optionally, there can be an image-producing element in the light path from the optical element to the field plane in addition to, or instead of, the field-shaping element. This could be the case if the light path has to be folded because of spatial considerations, or if aperture stops, for example field aperture stops, are to be used.

In certain embodiments, an illumination system with multiple primary light sources is used in a projection exposure apparatus, such as a projection exposure apparatus for microlithography. In a projection exposure apparatus of this type, in general, a mask is arranged in the area of the illuminated field in the field plane, and an image of the mask is formed on a light-sensitive carrier substrate via a projection objective. Such a projection exposure apparatus can be used to manufacture microelectronic components, such as semiconductor chips. The projection objective whereby an image of the mask in the illuminated area of the field plane is projected into the image plane is optionally an objective which has at least six mirrors (e.g., at least eight mirrors).

BRIEF DESCRIPTION OF THE DRAWINGS

The disclosure includes drawings, in which:

FIG. 8 shows an illumination system wherein no further optical element is arranged in the light path from the optical element with multiple primary light sources the field plane, and wherein the element with multiple primary light sources, the so-called multi-source array is not arranged in a pupil plane nor in a field plane nor in a plane that is conjugate to the field plane or to the pupil plane;

FIG. 18A represents an optical element with multiple and 18B light sources.

DETAILED DESCRIPTION

With the illumination system disclosed herein, including an optical element with multiple light sources, the different primary light sources illuminate different areas in the field plane of an illumination system. Different illumination systems and microlithography apparatus including such an illumination system with an optical element having multiple light sources are shown in the figures.

Figure 1A:
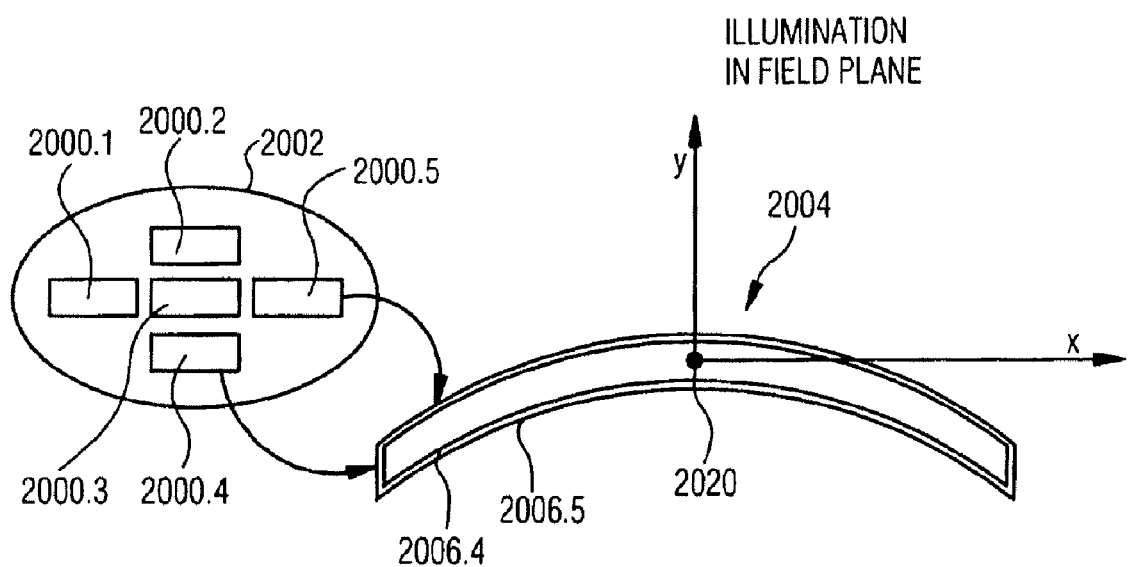
FIGS. 1A and 1B represent the illumination of a field in a field plane.
Figure 1B:
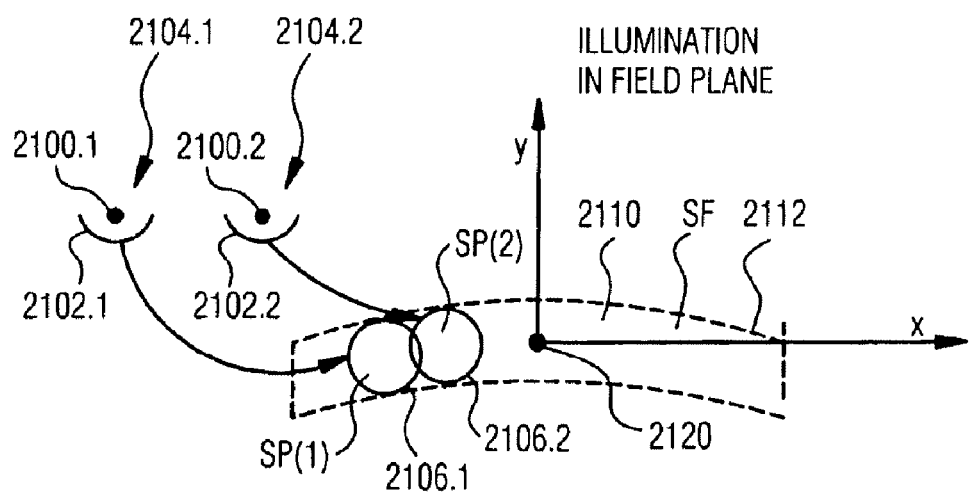
Figure 1C:
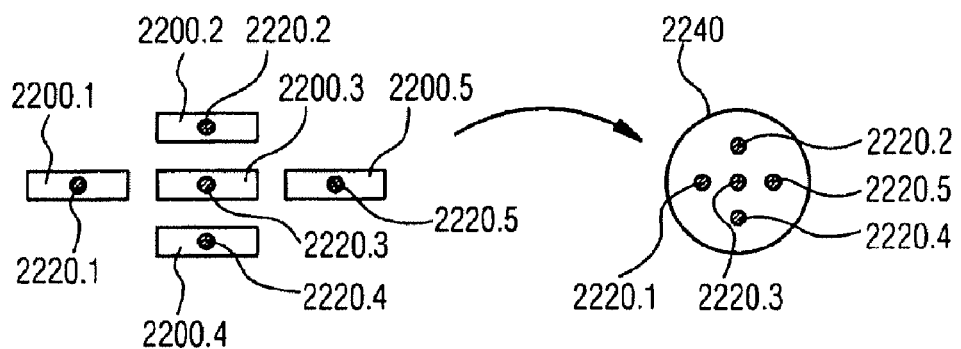
FIGS. 1C and 1D represent the illumination of an exit pupil in an exit pupil plane.
Figure 1D:
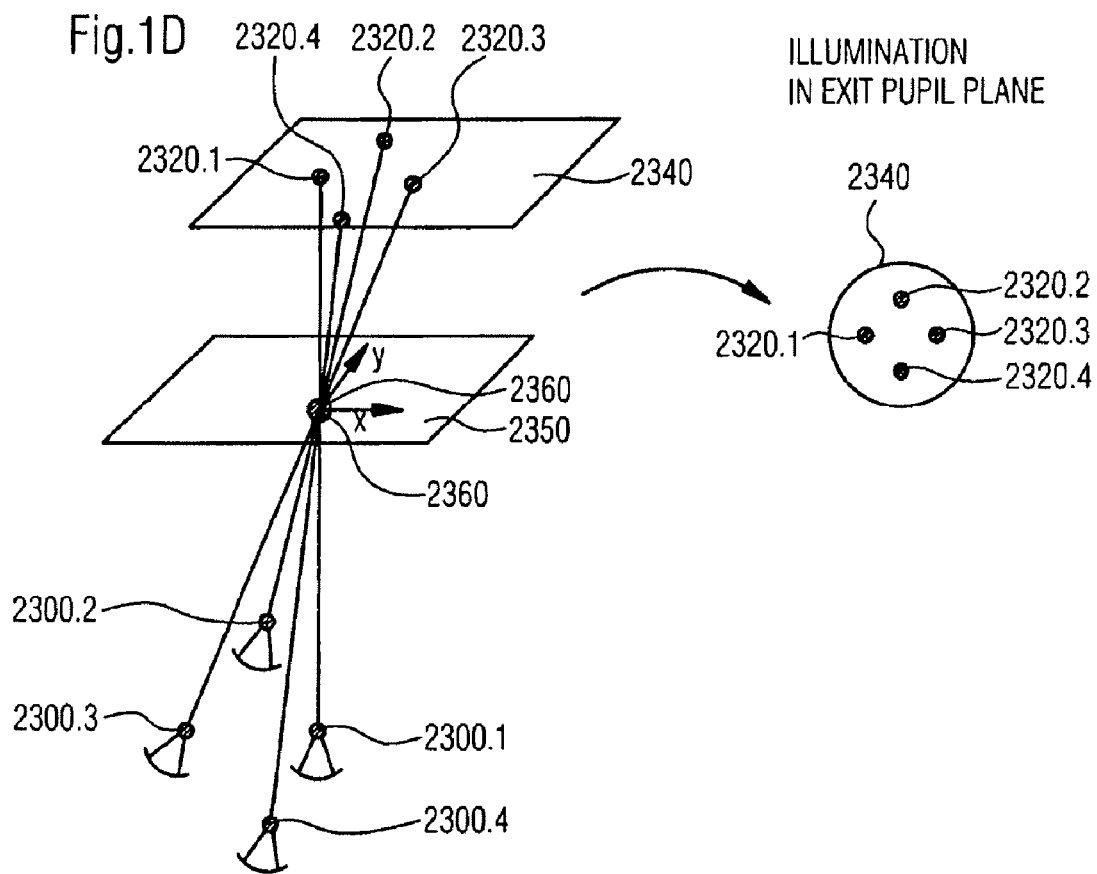

FIGS. 1A to 1B describe the difference of the illumination of the field plane by systems having fly eye lenses. FIGS. 1C and 1D show the difference of the illumination of the exit pupil according to a system with a Koehler illumination and of a system according to the disclosure.

In FIG. 1A the illumination in a field plane of an illumination system with two optical elements with raster elements, so called reflective fly-eye-lenses according for example to U.S. Pat. No. 6,438,139 or WO 2007/002170 is shown. Each of the raster elements 2000.1, 2000.2, 2000.3, 2004.4, 2000.5 of a first optical element 2002 with raster elements is projected in the field plane. In FIG. 1A the projection of the raster elements 2000.4 and 2000.5 in the field plane is shown. In the field plane 2004 which includes a coordinate system in x- and y-direction the images of each of the raster elements substantially overlap. In FIG. 1A only the illuminated areas 2006.4, 2000.5 of raster elements 2000.4 and 2000.5 are shown. By superposition of the images of all raster elements of the first reflective fly eye lens a substantially homogenous illumination in the field plane is achieved. When imaging the raster elements in the field plane an arcuate shape of the illuminated area is achieved, e.g. by a field forming mirror. The illuminated area is also denoted as field, which is illuminated in the field plane. In FIG. 1A also shown is the central field point 2020 of the field, which is denoted with x-/y-coordinate (0.0).

In FIG. 1B the illumination in the field plane according to a system of the disclosure is shown. In FIG. 1B two light sources 2100.1, 2100.2 out of the plurality of light sources of the optical element with a plurality of light sources are shown. Each of the light sources 2100.1, 2100.2 is associated to a collector 2102.1, 2102.2 forming a light source unit 2104.1, 2104.2. Each of the light sources 2102.1, 2102.2 illuminate a different area 2106.1, 2106.2 in a field plane of an illumination system. In case of a critical illumination images of each light source come to lie in the field plane. In case the focal points of the light sources and therefore their images come to lie in a plane before or after the field plane of the illumination system the illuminated areas in the field plane are not images of the light source and therefore denoted as illumination spots. It is now assumed that the images of the light sources lie outside the field plane. As shown in FIG. 1B each of the illumination spots 2106.1, 2106.2 come to lie in different areas in the field plane 2108. The total illumination in the field plane is then a superposition of the illumination spots 2106.1, 2106.2. In a some embodiments the superposition leads to an illumination of a field 2110 with an arc-shaped field contour 2112. As is apparent the size of the area illuminated in the field plane by the images of the light source or the illumination spots 2106.1, 2106.2 is smaller than the size of an area encircled by a field contour in the field plane. Also shown in FIG. 1B is the central field point 2120 of the field 2110 and a x-/y-coordinate system.

The size of the illumination spots is denoted by SP(1) for the illumination spot 2106.1 and SP(2) for illumination spot 2106.2. The size of an illumination spot can be calculated by an area integral $$\iint_{area(1)} dxdy = SP(1)$$

or $$\iint_{area(2)} dxdy = SP(2)$$

for each of the illumination spots 2106.1, 2106.2 in the field plane.

Also the size SF of the area encircled by the field contour in the field plane can be calculated by an area integral.

$$\iint_{area(field)} dxdy = SF$$

The size SP(1), SP(2) of an area illuminated by each illumination spot 2601.1, 2106.2 in the field plane is smaller than the area SF of the field encircled by the field contour, thus SP(1)<SF and SP(2)<SF holds. The size SP(1), SP(2) could be different for different illumination spots. In some embodiments, the size SP(1), SP(2) is less than $\frac{1}{10}$ SF (e.g., less than $\frac{1}{50}$ SF, less than $\frac{1}{100}$ SF, less than $\frac{1}{1000}$ SF). The illumination of the field in the field plane encircled by the field contour is the sum of the intensities of all illumination spots lying within the field contour 2112.

In FIG. 1C the illumination in an exit pupil of a illumination system having a Koehler illumination is shown. In a double facetted illumination system a light bundle of a primary light source is divided into a plurality of light bundles by field raster elements of a first reflective fly-eye-lens. Each field raster element provides for a secondary light source. The position of each secondary light source associated to each field raster element is determined by the shape, the orientation and the optical power of the associated field raster element. In FIG. 1C five raster elements 2200.1, 2200.2, 2200.3, 2200.4 and 2200.5 and the associated five secondary light sources 2220.1, 2220.2, 2220.3, 2220.4 and 2220.5 are shown. The secondary light sources are then projected by further optical elements, such as pupil raster elements into an exit pupil plane. In an illumination system with a Koehler illumination, the images of the of the secondary light sources lie in the exit pupil plane. According to the position of the images of the secondary light sources, which are also denoted as tertiary light sources the exit pupil is illuminated. The exit pupil can then have an illumination for example with a circular exit pupil contour or short spoken a circular illumination. Also a annular or a multipolar illumination would be possible.

In FIG. 1D the illumination in an exit pupil of a system not having a Koehler illumination with multiple primary light sources is shown. The bundles originating from the primary light source 2300.1, 2300.2, 2300.3, 2300.4 itself illuminate associated areas or illumination spots 2320.1, 2320.2, 2320.3, 2320.4 in the exit pupil plane 2340. The position of the illumination spots 2320.1, 2320.2, 2320.3, 2320.4, originating from the primary light source determine the illumination in the in the exit pupil 2340. Therefore the illumination in the exit pupil plane can be determined by the position of each primary light source and eventually the associated collector to each primary light source in a system with multiple primary light sources. In FIG. 1D the field plane is denoted with reference number 2350. In FIG. 1D one field point of the field illuminated is shown. The field point shown in FIG. 1D is the central field point 2360, from which a x-/y-coordinate system originates.

Generally speaking in a system which has not a Koehler illumination nor a critical illumination, the primary sources are imaged in a plane which does not coincide with neither the pupil plane nor the field plane. In this way the spot size on the reticle as well as the homogeneity of the pupil can be controlled.

As described above, the illuminated area in the field plane can be defined by the distribution of the emission angles of the individual primary light sources. By an individual tilting of the respective optical axes of the light bundles emitted by the individual primary light sources, it is possible with each light bundle to illuminate different areas in the field plane. The primary light sources are designed so that when all areas illuminated by the primary light sources are summed up, the resulting total illumination in the field plane will have a predetermined shape, for example the shape of a ring field segment. This is shown in FIG. 1B. Furthermore, the arrangement of the primary light sources is selected so that not only a field in a field plane is illuminated in a predetermined shape, but also an exit pupil, for example in an annular, bipolar or quadrupolar shape as shown in FIG. 1D.

In order to achieve the desired ring-shaped illumination in the field plane and the desired illumination of the exit pupil, a very complex arrangement of the primary light sources in relation to each other can be involved. It is possible that geometrically adjacent primary light sources illuminate image points that are far apart from each other in the exit pupil. It is possible to calculate the arrangement of the light sources as well as their distribution of emission angles by way of a so-called grid transformation. In a grid transformation, every pupil that belongs to a field point is represented by a specific grid.

The grid transformation is now described in detail.

Figure 1E:
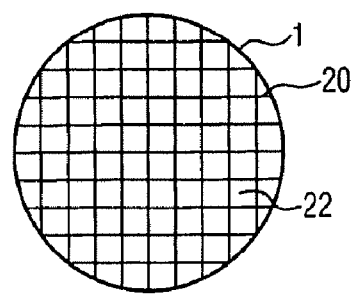
FIG. 1E represents a circular exit pupil of the illumination system with cells of a grid.

A grid is shown in FIG. 1E for a circular illuminated exit pupil. The exit pupil 1 is subdivided into a grid 20 with cells 22 of equal size. The equally sized cells 22 have equal power densities (equal radiation intensities). In accordance with the dimensions of the primary light sources, and taking the desired telecentricity properties for the pupil illumination in the exit pupil into account, a number of discrete field points are selected with which a homogeneous illumination of the exit pupil is achieved.

Figure 2:
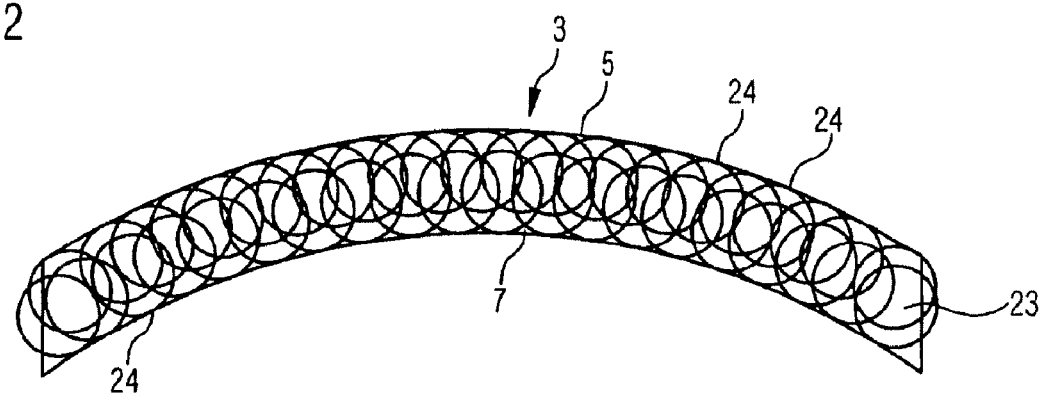
FIG. 2 represents illuminated areas in a field plane of the illumination system.

These discrete field points 23 are shown in FIG. 2 together with the border of the area 24 that is illuminated by a primary light source. In the case of a critical illumination, the area 24 coincides substantially with the images of the respective primary light sources. In the case the images of the primary light sources are not projected in the field plane, the area 24 corresponds to an illumination spot caused by each of the primary light sources in the field plane. Also shown is the field contour 5 of the illuminated field 7. The illuminated field in a field plane is obtained by adding up the individual illuminated areas 24 of the primary light sources, e.g. or the illumination spots caused by the primary light sources in the field plane.

The grid of the respective exit pupil according to FIG. 1E is traced back through each area 24 of an illumination of a primary light source in the field plane into the plane in which the primary light sources are arranged. By the superposition of the grids and the respective pupils that belong to different images of light sources, a complicated network is produced at the location of the primary light sources.

Figure 3:
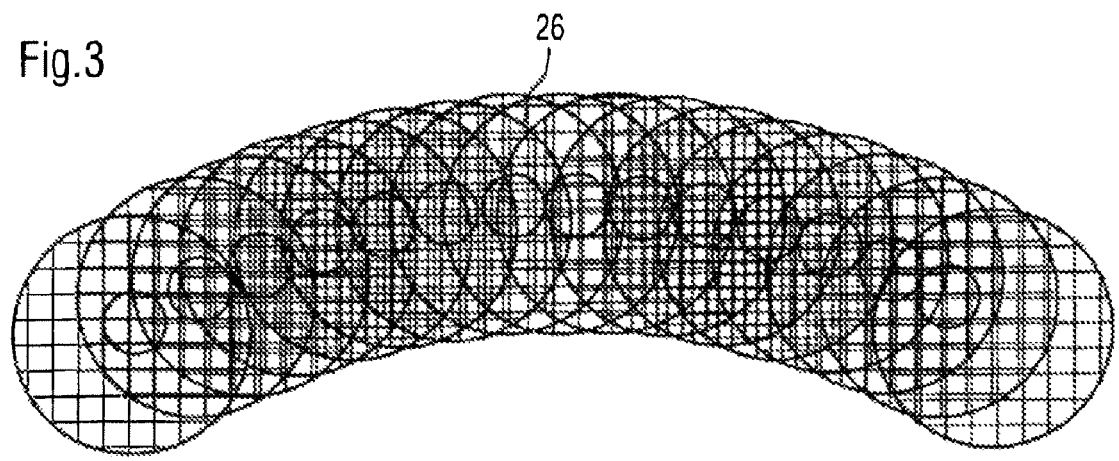
FIG. 3 represents the grid structure for multiple primary light sources in the plane in which the optical element with multiple light sources is arranged.

This network is referred to as the facet network 26. A facet network 26 of this kind is shown in FIG. 3. A transformation network is now calculated for the plane in which the multiple primary light sources are arranged, wherein as a boundary condition the desire for equal radiation intensity of each cell in the exit pupil is imposed. The facet network is overlaid on the transformation network, and the facet network is transformed in such a way that the transformation network becomes a square grid, i.e. evenly spaced and orthogonal. A facet is now drawn around each grid point of the transformed facet network. Next, the facet network is transformed back onto the transformation network. As a result, facets of different sizes and of a different position are obtained which is defined by an associated field point. The angle of inclination of the individual primary light sources that are associated with each facet is now adjusted in such a way that the ray emitted by the primary light source into the respective facet point is steered from the center of the primary light source in the direction of the associated field point.

Figure 4:
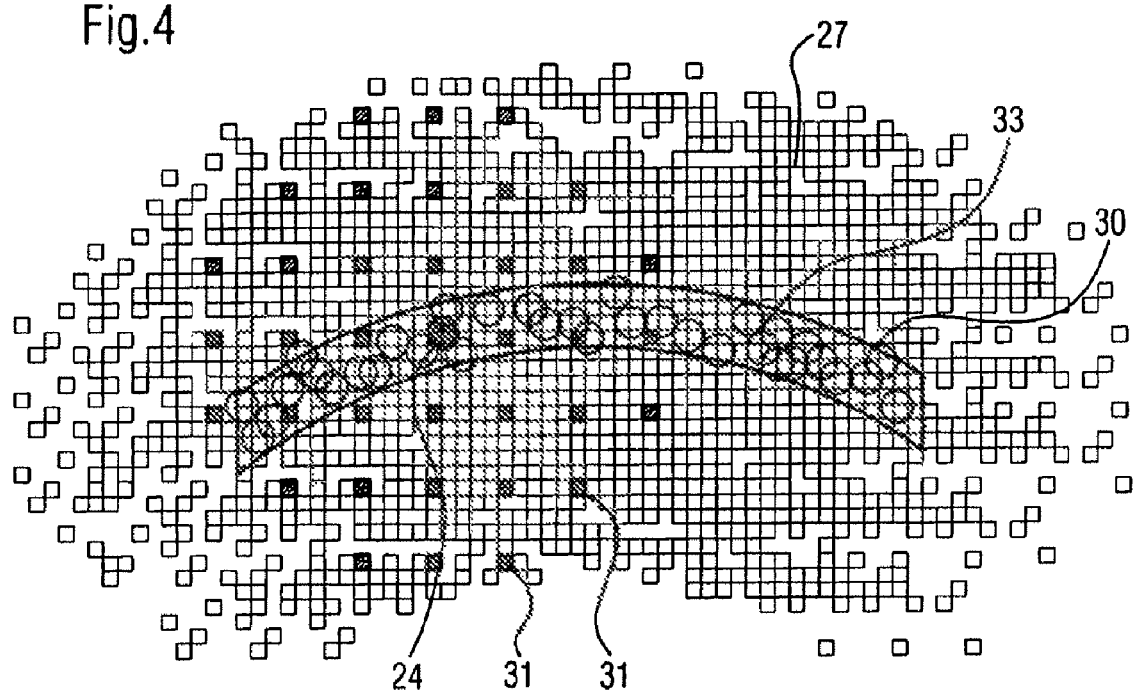
FIG. 4 represents the grid structure for multiple primary light sources in the plane in which the optical element with multiple light sources is arranged, subsequent to transformation into a grid which provides an equal radiation intensity of each illuminated area in the exit pupil.

FIG. 4 shows an example for the transformation network that is obtained under the boundary condition of equal radiation intensity for each cell. A multitude of rectangular areas 27 are shown, which are respectively associated with a primary light source, or in which a respective primary light source is arranged. By controlling the individual angles of inclination of the respective light rays emitted by the primary light sources, a multitude of field points and pupil locations can be illuminated. In FIG. 4, the field points 29 are identified which are projected back into the plane of the optical element with multiple light sources. Also indicated is the contour or field shape 30 of the illuminated field 33 in the field plane. Specially marked in FIG. 4 are the primary light sources 31, which in essence illuminate the dark-filled area 24 in the field plane. The illumination spots or illumination points of the primary light source 31 are in essence super imposed in the dark-filled area 24 of the field plane. As can be seen clearly, the dimension or size of the area 24 is significantly smaller than the dimension of the field to be illuminated which is defined by the contour 30. According to the disclosure, the field contour 30 of the field is illuminated by the summation of a multitude of illumination spots 24 as described with reference to FIG. 1B.

Although the description of FIGS. 1E to 4 is made for a critical illumination the description is not limited thereto.

The optimization can be carried out not only with a view towards the most uniform possible illumination of the exit pupil but also taking into account the uniformity of the field plane. Accordingly, the primary light sources are to be placed differently.

For an improved illumination of the exit pupil of the illumination system, the arrangement can also be selected in such a way that for any integration of the portions of the illumination in the field plane which lie on a straight line that runs in the scan direction, the same integral value for the partial illumination of the exit pupil is obtained.

FIGS. 5A to 7 show embodiments of an optical element with multiple primary light sources in a regular arrangement as it is used in an illumination system. Especially in the FIGS. 5A to 7 is shown how the light beams which are emitted form each of the primary light sources of the multiple primary light sources can be directed to different positions in a field, such that different areas in a field are illuminated.

Figure 5A:
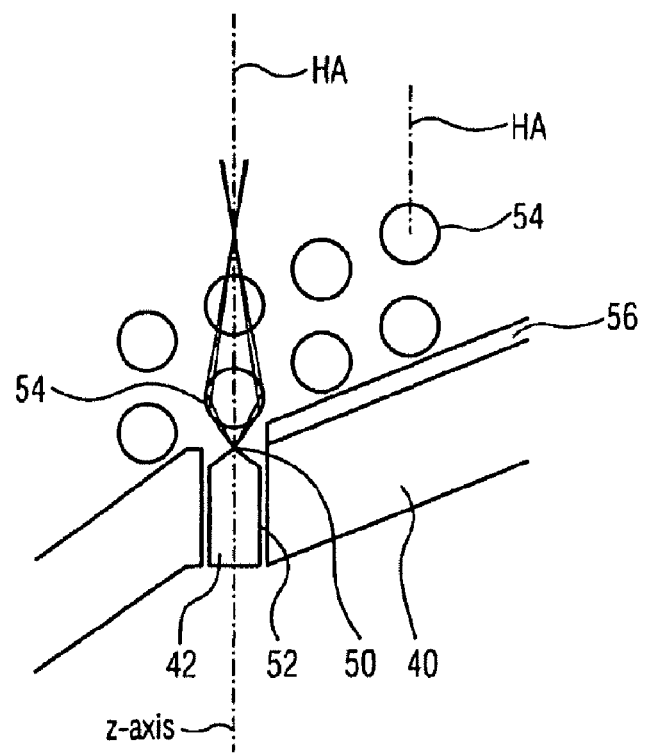
FIG. 5A shows an optical element with multiple primary light sources.

FIG. 5A represents such a component with multiple primary light sources. The component consists of two parts, one of which is a light-element part 40 which contains the multiple primary light sources 42. As can be seen in FIG. 5A, these primary light sources 42 are constituted for example by discharge light sources. The primary discharge light sources are arranged in a regular array of columns and rows. Possible discharge light sources include Ne (neon) or $N_2/O_2$ discharge light sources. Discharge light sources with other inert gases such as helium or argon are likewise conceivable and possible. The diameter of an individual light source is approximately 200 μm. As another gas filling, a Xenon (Xe) filling could be used. A discharge source with Xe filling can generate light pulses with an EUV wavelength of 13.5 nm. The power output of this kind of primary light source is in the range of 5 to 200 watt. The diameters of the primary light sources are in the range from 0.1 to 40000 μm, such as from 100 to 400 μm. The voltages at which the light sources are operated are in the range from 100 V to 3000 V, such as 600 to 1000 V. With dimension of 200 μm for a primary light source, an array with dimensions in the range of a few centimeters can accommodate several hundred to several thousand primary EUV light sources.

The primary light sources which emit EUV radiation can be for example hollow cathode light sources, capillary light sources, or the z-pinch plasma sources described above. Also possible are laser plasma sources.

The light rays of the light source are released through a hole 50 in a hollow cathode 52. Based on the dimensions of the hollow cathode 52, it is envisioned in light sources of this type to collect the light by reflective surfaces 54 which are arranged in the light path from the light source to the field plane that is to be illuminated. The reflective surfaces 54 are also referred to as collector surfaces. One collector surface is assigned to each light source. A correlation of this kind is advantageous but by no means an absolute requirement.

The reflectors 54 shown here are arranged with rotary symmetry about an optical axis HA. The collectors reflect the light at a very shallow angle, i.e. with grazing incidence. If a rotary paraboloid is selected as a collector surface, a substantially parallel alignment of the light rays is obtained downstream of the collector associated with the respective primary light source.

However, a collector with a convergent effect on the light beams can be desired, for example a collector with a surface in the shape of a rotary ellipsoid. Combined surfaces, for example combinations of rotary ellipsoids and rotary hyperboloids, are likewise possible. As a result of the convergent effect of the rotationally symmetric collector surface, the multiple primary light sources are projected into multiple light source images. In some embodiments, these light source images lie in a plane which is neither a field plane of the illumination system nor a exit pupil plane of the illumination system nor a plane that is conjugate to the field plane or conjugate to the exit pupil plane. In such a case in the field plane only illumination spots as shown in FIG. 1B come to lie, whereas the images of the primary light sources are situated in a plane in the light path before or after the field plane. Nevertheless the position of the images of the primary light sources in a plane influence the position of the illumination spots in the field plane. If the illumination system is part of a projection exposure apparatus with a projection objective, the field plane of the illumination system coincides with the object plane of the projection objective, and the exit pupil plane of the illumination system coincides with the entrance pupil plane of the projection objective. Arranged in the field plane of the projection objective is the object of which an image is to be projected, for example a structured mask, the so-called reticle into a image plane of the projection objective. Arranged in the pupil plane is for example the aperture stop of the projection objective. To each field point can be assigned an energy-weighted central ray representing the center of gravity of the bundle of rays originating from this field point. In an ideal case the complete set of all these energy-weighted central rays intersects in the pupil plane 85 or 87 resp., which coincides or is conjugated to the entrance pupil of the subsequent projection optics. The energy-weighted central ray is also denoted as chief ray.

Figure 5B:
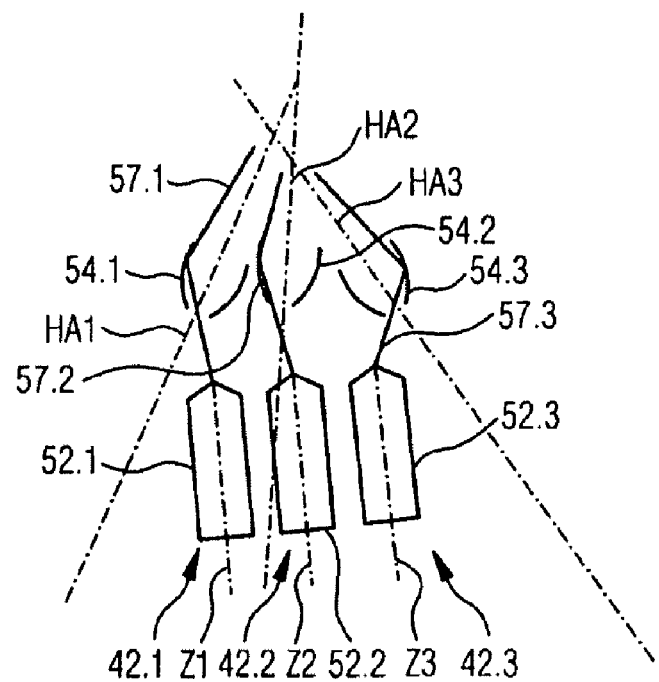
FIGS. 5B-5F show different arrangements relative to each other of the primary light sources and of the collectors assigned to the primary light sources.

The position of the light source images or the illumination spots in the field plane can generally be controlled, for example with uniformly aligned primary light sources, by adjusting the position, i.e. tilting and/or moving of the grazing-incidence collectors associated with the respective primary light sources. The tilting of the collectors relative to the light sources is illustrated in FIG. 5B. What has been the in the context of FIG. 5A regarding the possibility for position adjustment, which can include tilting and/or shifting, applies in principle for all of the embodiments illustrated in FIGS. 5B to 5F.

Associated with each of the primary light sources 42.1, 42.2, 42.3 is an axis z1, z2, z3, respectively, which represents the symmetry axis of the respective hollow cathode 52.1, 52.2, 52.3.

The symmetry axes z1, z2, z3 of the hollow cathodes 52.1, 52.2, 52.3 in the illustrated example are oriented substantially parallel to each other. The individual grazing-incidence collectors 54.1, 54.2, 54.3 assigned to the primary light sources 42.1, 42.2, 42.3, likewise, each have a symmetry axis HA1, HA2, HA3. The shells of the grazing-incidence collectors are surfaces running in a closed loop with rotational symmetry relative to the respective symmetry axis HA1, HA2, HA3 (so-called rotational shells). The direction of the light bundle reflected by a collector substantially coincides with the direction of the symmetry axis HA1, HA2, HA3 of the respective collector. Thus, the direction of the reflected light ray bundle 57.1, 57.2, 57.3 can be set and adjusted by changing the direction of the symmetry axis HA1, HA2, HA3 of the respective collector. Accordingly, the position of the light sources images or the illumination spots in a field plane can be adjusted by tilting of the respective grazing-incidence collectors relative to the primary light sources.

Figure 5C:
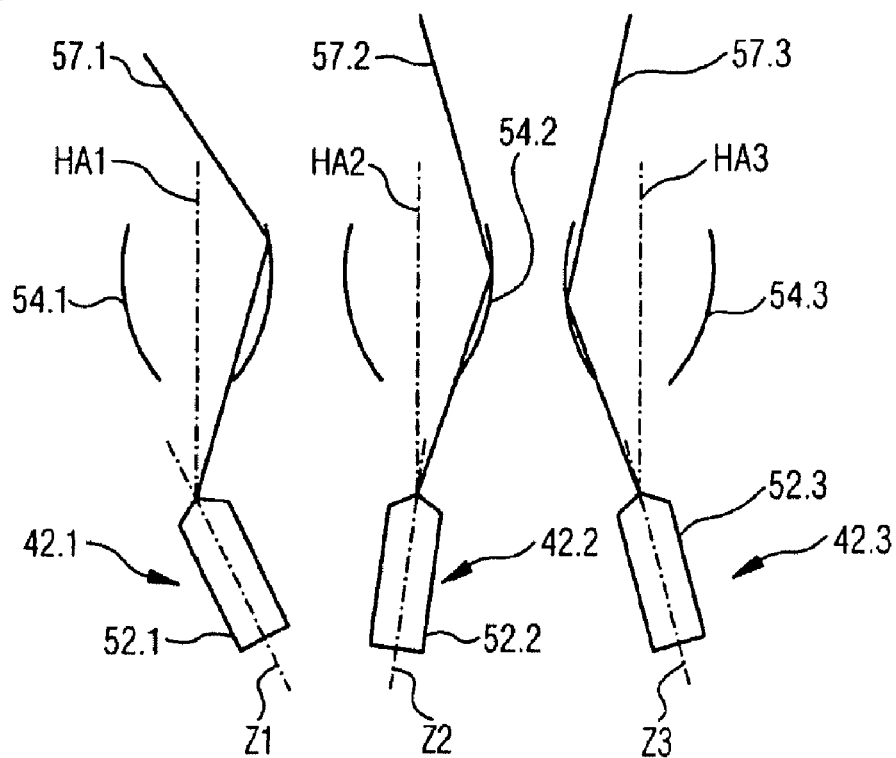

Conversely, the collectors can also take on a position where the symmetry axes HA1, HA2, HA3 are parallel, and the symmetry axes z1, z2, z3 of the primary light sources are being tilted in order to set the position of the light source images. This is illustrated in FIG. 5C.

Figure 5D:
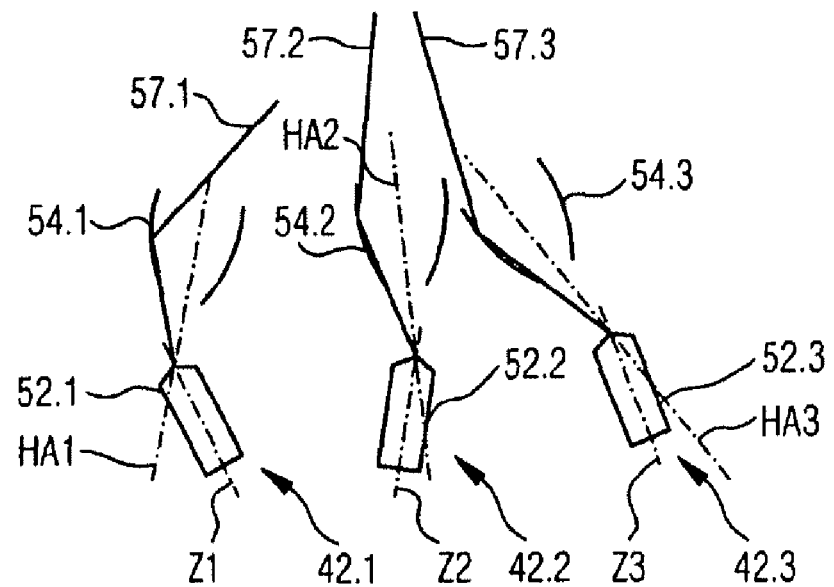

Of course, it is also possible that the symmetry axes z1, z2, z3 of the light sources as well as the symmetry axes HA1, HA2, HA3 of the respectively associated collectors are tilted, i.e. are not parallel, relative to each other, as illustrated in FIG. 5D.

The grazing-incidence collectors can be rotational shells, for example ellipsoids, or composite surfaces consisting of a hyperboloid segment and, adjacent to the latter, an ellipsoid segment, as disclosed in U.S. Pat. No. 7,015,489, which is hereby incorporated by reference in its entirety. Collectors with a plurality of rotational shells arranged within each other are referred to as nested collectors. Systems with composite surfaces consisting for example of a hyperboloid segment and an ellipsoid segment are referred to as Wolter systems.

Another possibility to consider are collectors, which have so-called free-form surfaces with no rotary symmetry about a unique axis. In collectors of this kind, the position of a light source image would not be adjusted by a tilting of the collector but by the shape of the optical free-form surface itself. Of course, it is also conceivable that a collector with a free-form surface is in addition being tilted.

Finally, the positions of the light source images could also be adjusted by light sources with an asymmetric emission of radiation whose directional emission characteristic can be adjusted, i.e. the position of the light source images and thus the illumination in the field plane and the pupil plane of an illumination system can be determined by the directional light-emission characteristic of the source.

As described above, the discharge-based light source itself has a preferred axis, which for example in a pinch plasma source is the z-axis in the longitudinal direction of the discharge cavity, and if the collector is configured with rotary symmetry about an axis, the symmetry axis HA represents a preferred axis.

The arrangement of the multiple light sources and collectors can be selected so that the superposition of the illuminated areas in the field plane adds up to a predetermined field shape, for example the shape of a ring field as shown in FIG. 1B. Furthermore the arrangement of the multiple light sources and collectors can be selected such, that the illuminated areas in an exit pupil plane provide for a predetermined exit pupil illumination, e.g. a circular exit pupil illumination having e.g. a certain telecentricity.

The collectors 54, 54.1, 54.2, 54.3 can be arranged in a collector micro-array 56 of their own which can for example also be moved in relation to the light element part 40.

A configuration as a single unit is also possible, wherein the light sources together with the collectors form one light source micro-array.

In a configuration as a single unit, the different positions of the light source images as described above are achieved through the concept that the individual primary light sources and collectors take on specific angles relative to each other, for example that the collector axes are tilted in relation to the axes of the light sources or vice versa. It is also possible to actuate individual primary light sources with motors, or for example to actuate collectors with micro-motors and thereby to change the position of the light source in the plane.

Figure 5E:
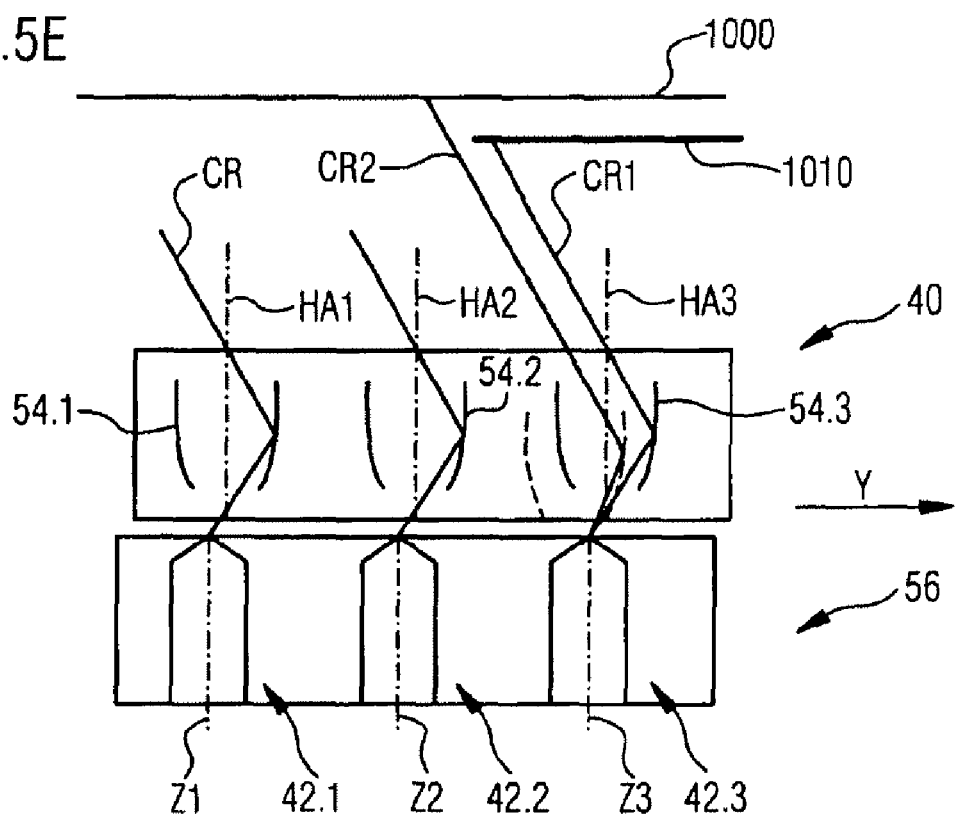

In a two-part configuration where the multiple primary light sources are arranged in a first array and the multiple collectors in a second array, such a change of the positions of the light source images can also be achieved for example by offsetting the first array 40 with multiple light sources relative to the entire array 56 of collectors by a displacement distance y. This is illustrated in FIG. 5E. Where components in FIG. 5E are identical to those in FIGS. 5C and 5D, they are identified by the same reference symbols. As can be seen in FIG. 5E, the entire first array 40 with primary light sources 42.1, 42.2, 42.3 is shifted in its position relative to the array 56 with collectors 54.1, 54.2, 54.3. This also allows the field illumination in the field plane to be moved.

Figure 5F:
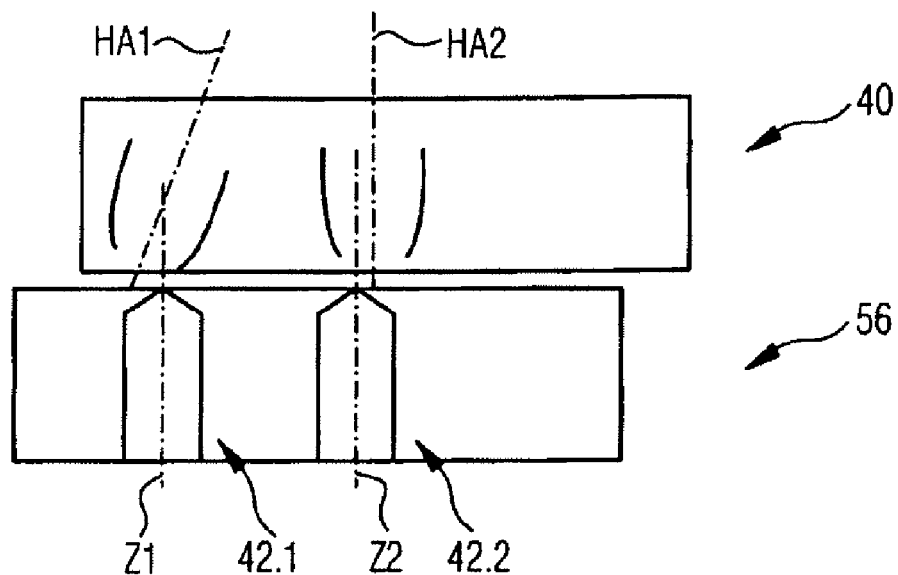
Figure 5G:
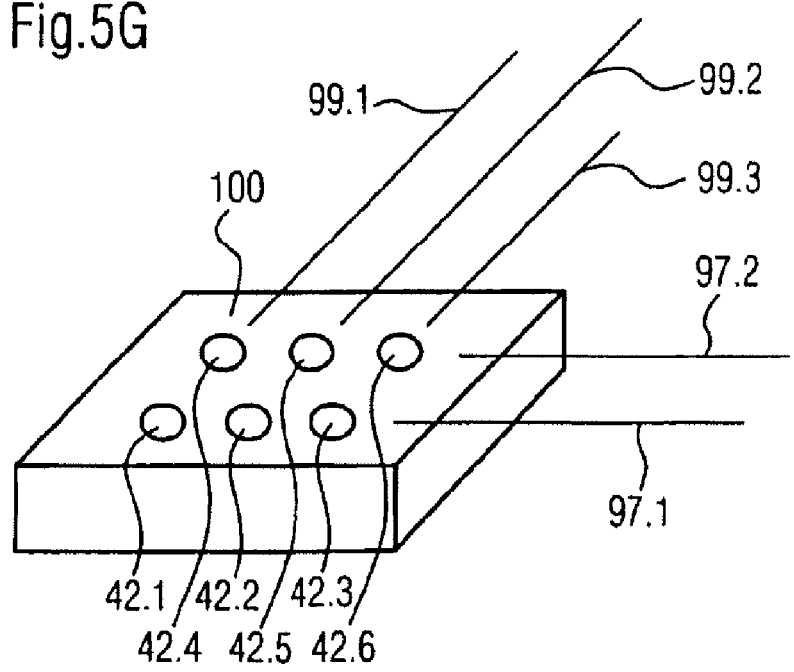
FIG. 5G shows a light source array with a regular arrangement.

Of course, the offsetting of the entire first array 40 with light sources relative to the entire second array 56 with collectors can also be coupled with an individual tilting of the individual primary light sources and/or collectors. This is illustrated in FIG. 5F. Components in FIG. 5F that are identical to those in FIG. 5E are identified by the same reference symbols. In this application an array of light sources denotes the two dimensional arrangements of light sources and collectors. The two dimensional arrangement could be any two dimensional surface such as a plane but also a curved surface. A special arrangement of such an array is an arrangement in rows and columns. A part of such an array with a multiple of light sources arranged in rows and columns is shown in FIG. 5G. In FIG. 5G the primary light sources 42.1, 42.2, 42.3 are arranged in a first row 97.1 and light sources 42.4, 42.5, 42.6 in a second row 97.2. Light sources 42.1, 42.4 are arranged in a first column 99.1, light sources 42.2, 42.5 in a second column 99.2 and light sources 42.3, 42.7 in a third column 99.3.

The relative offsetting of the arrays against each other as shown in FIGS. 5E and 5F changes the direction of a light bundle emitted by the light source. The direction of the light bundle is indicated by the chief ray CR. If the direction of the chief ray CR is changed by shifting the arrays relative to each other, this has for example the result that different areas are illuminated in a field plane which in FIG. 5E is identified by the reference symbol 1000. If the two arrays are not offset relative to each other, the direction of the chief ray is CR1. By a displacement of an amount y, the direction of the chief ray is changed into the direction CR2. Now, if for example a field aperture stop 1010 is arranged in the field plane that is to be illuminated, the light bundle which has been deflected due to the offset falls with its chief ray onto the field aperture stop 1010 and therefore does not contribute to the illumination of the field plane. In this way, it is possible by way of the position-shifting to influence the illumination in the field plane, in particular the so-called uniformity in the field plane, in a specifically targeted way. It is also possible to tilt the entire array consisting of individual primary light sources and collectors by a certain angle. This also results in a change of the illumination.

Likewise, as the light source array together with the multiple collectors that are respectively assigned to each primary light source can be influenced by tilting and/or shifting, it is possible to influence not only the illumination or uniformity in the field plane, but also the shape and the characteristics of the illumination in the exit pupil, i.e. the so-called setting and i.e. the telecentricity of the illumination in the exit pupil.

Besides grazing-incidence collectors which, in the light path from the light source to the plane to be illuminated, such as to the field plane, are arranged in front of the light source, it is possible to envision an alternative embodiment where the collectors are configured so that they also take in light emitted in the rearward direction. A system of this kind would be for example a system in which the LED diodes 69.1, 69.2, 69.3, 69.4 are used as primary light sources. In LED diode arrays of this kind it is customary to collect the light by rear reflectors 73.1, 73.2, 73.3, 73.4.

Such rear reflectors 73.1, 73.2, 73.3, 73.4. have a preferred direction in relation to which they can have a rotationally symmetric configuration. The rear reflectors, too, can be designed in such a way that they have a light-converging effect.

Figure 6:
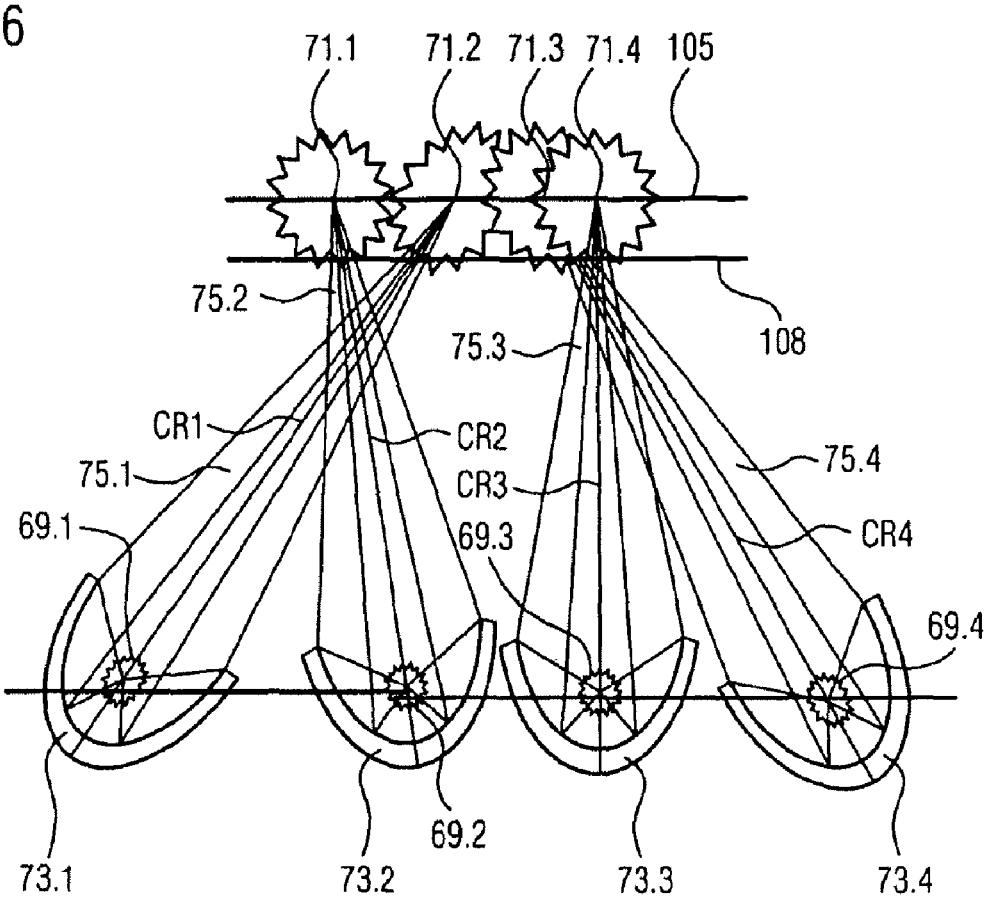
FIG. 6 represents an optical element with multiple primary light sources in an illumination system with the light source images lying outside the field plane.

In FIG. 6 a system with such rear reflectors 73.1, 73.2, 73.3, 73.4 are shown. The primary light sources 69.1, 69.2, 69.3, 69.4 are projected in a plane 105. In plane 105 images 71.1, 71.2, 71.3, 71.4 of the primary light source are produced.

The field plane in which an object to be illuminated can be situated is denoted with reference number 108. As is clear from FIG. 6 the images of the light sources do not lie in field plane 108. Each light source therefore illuminates a so called illumination spot in field plane 108. The sum over all illumination spots as discussed with regard to FIG. 1B provides for the field illumination, which can have e.g. an arc-shaped field contour. In order to be able to illuminate the desired contour shape in the field plane, it is desirable to project the images of the respective primary light sources into different areas in the field plane. To achieve this, the individual light bundles 75.1, 75.2, 75.3, 75.4 emitted by the respective primary light sources 69.1, 69.2, 69.3, 69.4 are tilted relative to each other as shown in FIG. 6. The tilt angles of the individual light channels or light bundles 75.1, 75.2, 75.3, 75.4 Relative to each other are defined essentially by the tilt angles of the chief rays CR1, CR2, CR3, and CR4 of the respective light bundles 75.1, 75.2, 75.3, 75.4. A tilting of the chief rays CR1, CR2, CR3, CR4 of the light bundles 75.1, 75.2, 75.3, 75.4 associated with the respective primary light sources 69.1, 69.2, 69.3, 69.4 can be achieved in different ways. The reflector assigned to the respective primary light source 69.1, 69.2, 69.3, 69.4 is being tilted. The tilting of the reflector has the effect that the light bundle defined by the reflector has a tilted chief ray. By tilting the light sources and illuminating different areas in the field plane not only different field contours can be illuminated, but also the homogeneity of the illumination by mixing different illumination spots can be influenced.

In FIG. 6, the light source 69.1, 69.2, 69.3, 69.4 is tilted together with the reflector 73.1, 73.2, 73.3, 73.4, while the relative position between the reflector and the light source always stays the same. The light source and the reflector together form in this case a so-called light source unit. This is a possibility to realize the tilting of the light bundles 75.1, 75.2, 75.3, 75.4 originating, respectively, from the primary light sources 69.1, 69.2, 69.3, 69.4.

In some embodiments, all of the light sources 42 could be set up in a regular arrangement in a multi-source array in columns and rows as shown for example in FIG. 5G. The collectors which are assigned to the respective primary light sources are in this case arranged in a second component. In this second component, the collectors can be tilted relative to their associated light sources, or each collector assigned to a primary light source can have a very specific reflection characteristic, so that by the different relative positioning between the lights sources and their associated collectors different areas of the field plane 108 are illuminated.

In exactly the same way, it would of course be possible to assemble the collectors into a multi-collector array and to tilt or position the respective primary light sources assigned to the collectors in such a way relative to the collectors that the light bundle radiates in the desired direction into the field plane.

If the collectors assigned to the individual primary light sources are designed with a tilt or with the capability of moving in relation to the primary light sources, it is possible to illuminate different areas of the field plane and different areas in the pupil plane by moving or tilting of the individual collectors. By moving the collectors and/or the light sources relative to each other, it is possible to set different illuminations in the exit pupil.

As an alternative to setting illuminations in the exit pupil with reflectors or light sources that are movable relative to each other, it is conceivable to provide a multi-source array with a larger number of primary light sources than are desirable for an illumination, and to switch the light sources on and off individually.

Figure 7A:
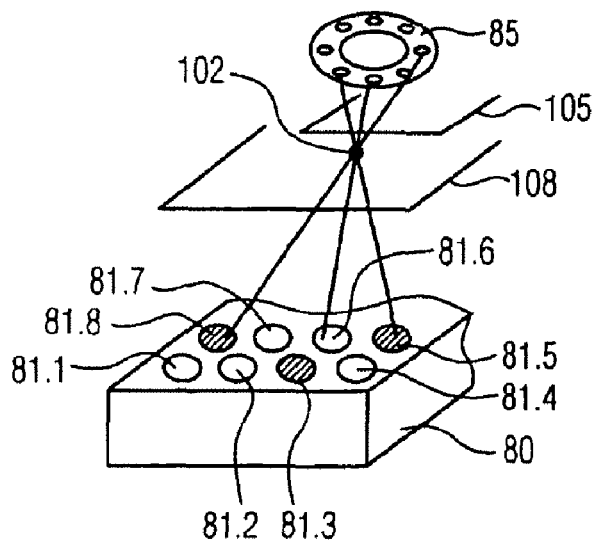
FIG. 7A-7B shows different pupil illuminations when switching on and off different light sources.
Figure 7B:
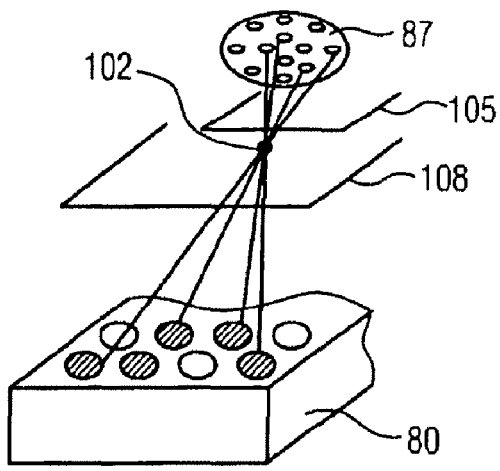

This is shown in FIG. 7A to FIG. 7B. In FIG. 7A a multiple light source array 80 with light sources 81.1, 81.2, 81.3, 81.4, 81.5, 81.6, 81.7, 81.8 is shown. Only the light sources 81.3, 81.5 and 81.8 are turned on. Each turned on light source provides for an image of the light source 83.3, 83.5 and 83.8 in a plane 105. The rays intersecting in a specific field point in the field plane 108 form the pupil in the associated pupil plane 85 or 87 respectively. The exit pupil contours belonging to different field points in plane 108 overlap congruently in the plane 85 or 87 respectively. To each field point can be assigned an energy-weighted central ray representing the center of gravity of the bundle of rays originating from this field point. In an ideal case the complete set of all these energy-weighted central rays intersects in the pupil plane 85 or 87 resp., which coincides or is conjugated to the entrance pupil of the subsequent projection optics. In FIGS. 7A and 7B only one field point of the field—the central field point 102—in the field plane 108 is shown. The illumination with the light sources turned on according to FIG. 7A provides for a ring shaped exit pupil 85.

In FIG. 7A different light sources, e.g. the light sources 81.1, 81.2, 81.4, 81.7 and 81.6 are turned on provided in an a circular exit pupil 87 belonging to a field point—here the central field point 102 of the field—in field plane 108.

As described above a first illumination in an exit pupil could be provided by a first subset of the multiple light sources, and a second illumination in an exit pupil could be provided by a second subset of the multiple light sources. By switching off the light sources associated with the first illumination out of the totality of the multiple primary light sources and switching on the second subset of multiple primary light sources, it is possible to perform a setting change very quickly. A setting change of this kind can be realized significantly faster than with a mechanical process.

The following FIGS. 8 to 13 show different illumination systems in which an optical element with multiple primary light sources is used.

FIG. 8 shows a first illumination system, wherein an optical element with multiple primary light sources is used in the illumination system. The optical element 100 with multiple primary light sources 101.1, 101.2, 101.3 performs the imaging of the primary light sources into a plane 105 which is not the field plane nor the pupil plane nor a plane conjugate to the field plane and/or the pupil plane, for example by collectors 103.1, 103.2, 103.3 which are assigned to the respective primary light sources, and also performs the shaping of the ring field in the plane 108 in which the object to be illuminated is arranged, as well as the illumination of the exit pupil 106 of the illumination system. The angles of inclination of the light bundles 109.1, 109.2, 109.3 emitted by the associated light sources and the arrangement of the primary light sources on the optical element can be calculated by the grid transformation as described previously herein. The optical element of the primary light sources as shown in FIG. 8 can include up to several thousand individual primary light sources. The location of the entry pupil of a projection system as illustrated, which coincides with the exit pupil of the illumination system, is defined by the point of intersection S of the optical axis HAO of the projection objective with the energy-weighted chief ray 107 of a light bundle to a field point of the field to be illuminated, for example the central field point. The energy-weighted chief ray represents the energy-weighted average of all illumination rays that pass through a field point 102. The optical element 100 with multiple primary light can be arranged for example as a multi-source array, wherein the primary light sources are arranged in rows and columns as shown for example in FIG. 5G. The field point 102 shown in FIG. 8 is the central field point of the illuminated field in the field plane 108. Furthermore shown in FIG. 8 is the plane 105 in which the light source images 104.1, 104.2, 104.3 are provided. As is apparent from FIG. 8 the light source images 104.1, 104.2, 104.3 are not provided in the field plane 108. Therefore each light bundle 109.1, 109.2, 109.3 provides for an illumination spot in the field plane 108.

Figure 9:
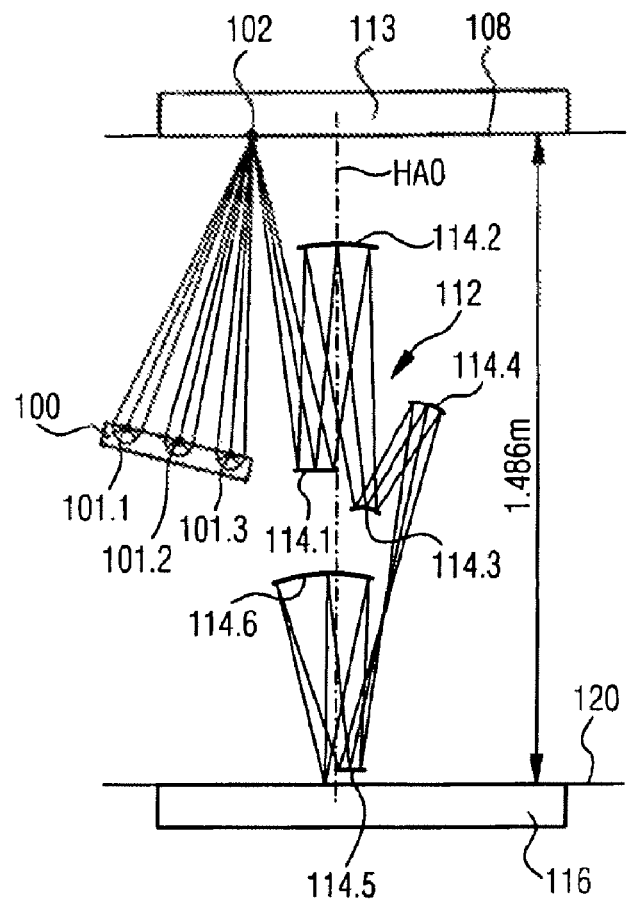
FIG. 9 shows a projection exposure apparatus with an illumination system which has no further optical element between the optical element with multiple primary light sources and the field plane, and with an illumination, wherein the images of the light sources are projected substantially into the field plane.

FIG. 9 illustrates a projection exposure apparatus with an illumination system in which no further optical components are arranged in the light path from the optical element 100 with a multiple of light sources to the plane that is to be illuminated which in this case coincides with the field plane 108. If the images of the primary light sources of the optical element 100 with a multiple of light sources in the embodiment of FIG. 9 are produced in the field plane, this example represents the special case of a critical illumination. As a general statement, the optical element 100 with a multiple of light sources as shown in FIG. 8 can be arranged in any desired plane which is not the field plane or conjugate to thereto nor the pupil plane or a plane conjugate to the pupil plane. In the projection exposure apparatus according to FIG. 9, the exit pupil 106 of the illumination system coincides with the entry pupil of the projection objective 112 that follows the illumination system. The projection objective 112 in this case is a six-mirror projection objective with mirrors 114.1, 114.2, 114.3, 114.4, 114.5, 114.6 as disclosed for example in U.S. Pat. No. 6,353,470. The optical axis of the projection objective is identified as HAO. Instead of a six-mirror projection objective, imaging systems with more than six mirrors which project an object, e.g. a reticle 113 that is arranged in the field plane 108 onto a light-sensitive object 116 situated in an image plane 120 are also conceivable. Only as an example, an eight-mirror projection objective as disclosed in US 2002/0154395 A1 should be mentioned here.

A projection exposure apparatus as shown in FIG. 9 or a projection exposure apparatus with an illumination system as shown in FIG. 8 and with a six-mirror projection objective or with an eight-mirror projection objective has a high light output since the number of the reflections in the illumination system is low.

Furthermore, such a system has very good imaging properties and correction capabilities due to the large number of mirrors in the image-producing projection objective. The projection objective 112 projects an image of a mask, which is also called a reticle 113 arranged in the field plane 108, into the image plane 120 where a light-sensitive object 116 for example a wafer is arranged. The mask in the field plane as well as the light-sensitive object in the image plane can be arranged so that they are capable of being moved, for example with so-called scanning stages, which are movable along the scan direction.

Figure 10:
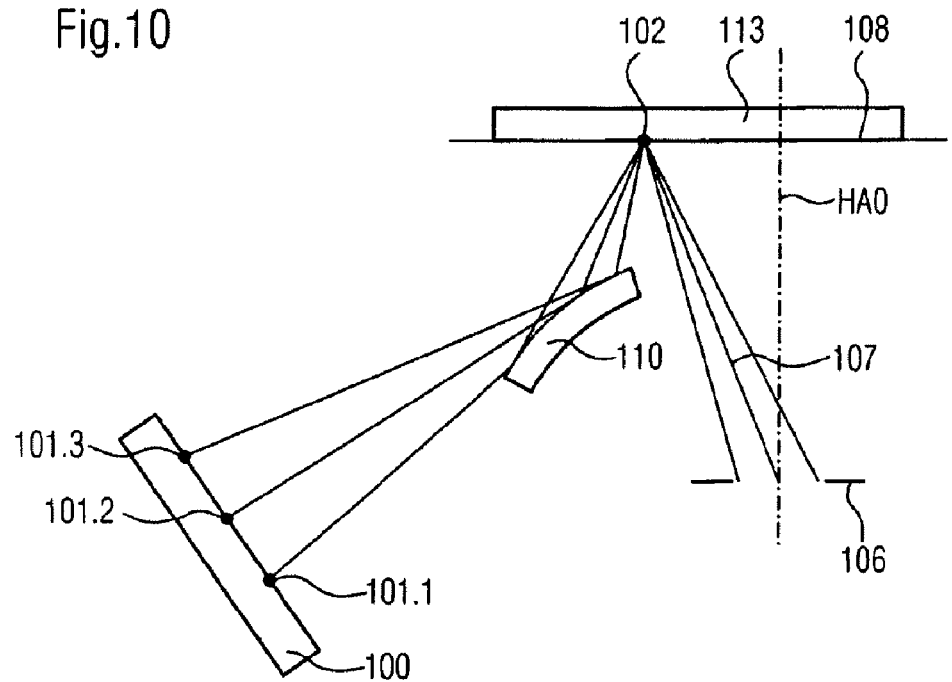
FIG. 10 represents an illumination system which is configured as a grazing-incidence mirror in the light path from the optical element with multiple primary light sources to the field plane.

In a further embodiment which is shown in FIG. 10, an illumination system with an optical element 100 with multiple primary light sources 101.1, 101.2, and 101.3 is presented, where a field-shaping element 110 is interposed in the light path from the optical element 100 to the field plane 108. Elements that are identical to those in FIG. 8 are identified with the same reference symbols.

An advantage of the system in FIG. 10 is the fact that the optical element 100 with multiple light sources in an embodiment according to FIG. 10 can be designed for a rectangular field.

The shaping into a ring field occurs through the field-shaping element 110 which in the present example is a field-shaping grazing-incidence mirror.

Figure 11:
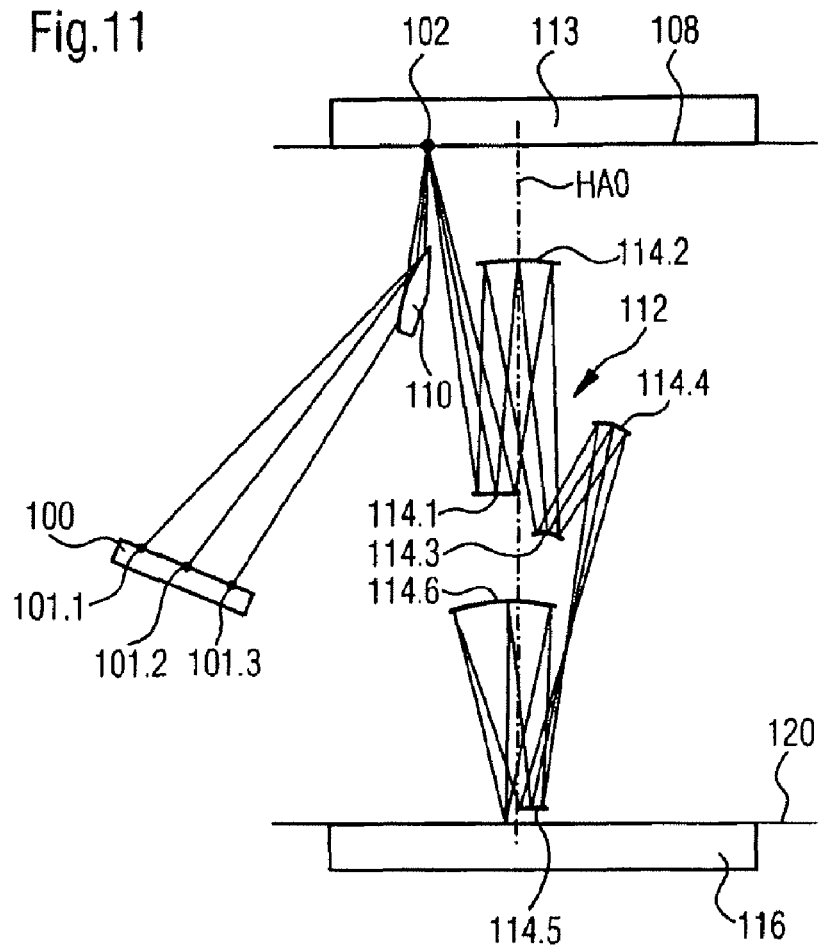
FIG. 11 represent a projection exposure apparatus with an illumination system according to FIG. 10.
Figure 12:
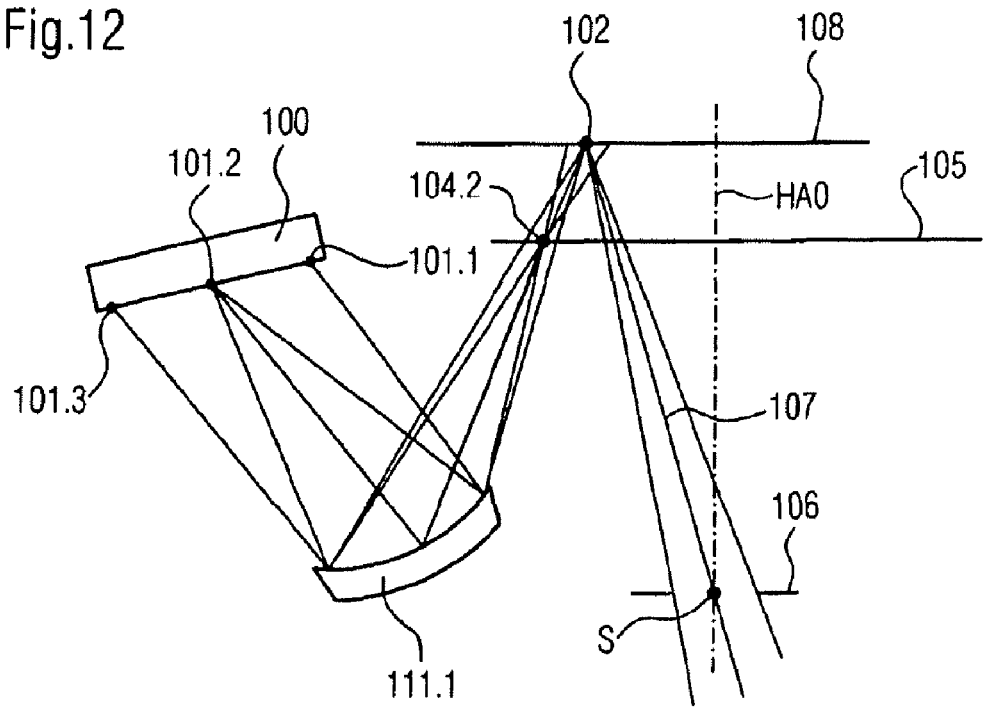
FIG. 12 represents an illumination system with an image-producing optical element in the light path from the optical element with multiple primary light sources to the field plane.

FIG. 11 illustrates a projection exposure apparatus with an illumination system according to FIG. 10. Elements that are identical to those in FIG. 9 are identified with the same reference symbols.

As an alternative to the illustrated illumination system, an illumination system with an optical element with multiple primary light sources can include one or more imaging elements 111.1, 111.2. An first embodiment of such an illumination system with one normal incidence mirror 111.1 as imaging optical element is presented in FIG. 12. FIG. 11 also has an optical element with multiple light sources 101.1, 101.2, 101.3 that is neither situated in a field plane 108 or a plane conjugated thereto nor in a exit pupil plane 106 or a plane conjugated thereto. Furthermore the system is a system in which the light source images 104.2 come to lie in plane 105, which is in the light path from the optical element 100 to the field plane 108 situated before the field plane 108. Also shown is the central field point 102 and the intersection point S of chief ray 107 to the central field point 102 with the optical axis HAO of a subsequent projection objective.

Figure 13:
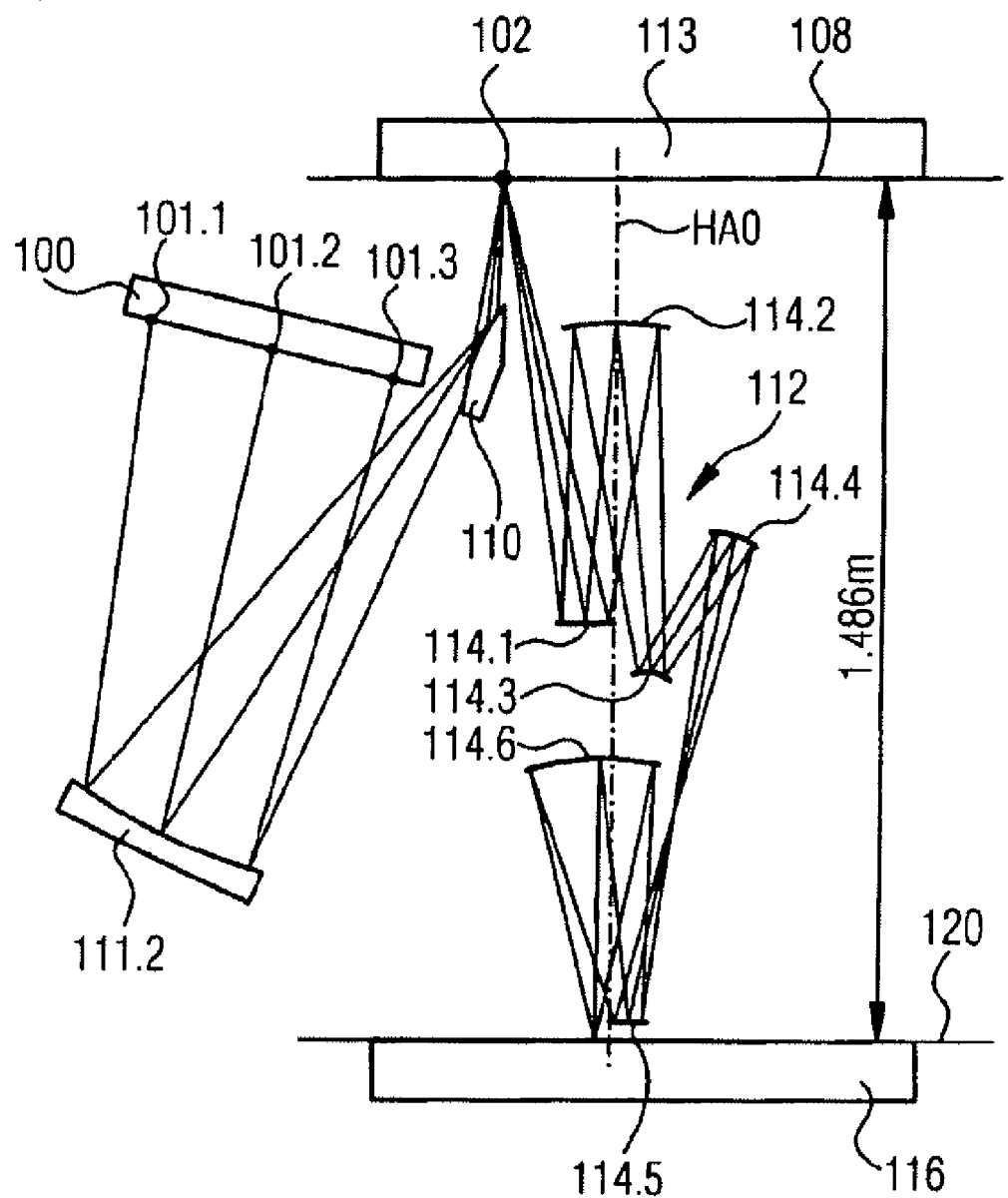
FIG. 13 shows a projection exposure apparatus with an illumination having image producing optical elements.

FIG. 13 shows one imaging optical element 111.2 and a field shaping element 110 is shown. The field shaping element 110 is a grazing incidence mirror. Components in FIGS. 12 and 13 that are identical to those in FIG. 10 or 11 carry the same reference symbols. The element 111.1, 111.2 which performs an imaging function can project the optical element 100 with multiple primary light sources 101.1, 101.2, 101.3 into the exit pupil of the illumination system. Of course it is also possible to use several optical imaging elements which may even have the capability to produce an intermediate image of the ring field segment in the field plane 108 in case that aperture stops are used. Using additional images or other mirrors can be advantageous if the ray geometry has to be additionally folded for example in order to arrange the optical element with multiple light sources in a more accessible space. This is obviously the case in FIG. 13. In all of the systems shown in FIGS. 8 to 13 the optical axis HAO of the projection objective 112 is indicated. The exit pupil of an illumination system, which coincides with the entry pupil of the projection exposure apparatus, is defined as the point of intersection of the energy-weighted central ray to the different field point of the optical axis HA. This can be seen with particular clarity in FIGS. 8 to 10, where the exit pupil is identified by the reference symbol 106. It is to be understood that one could use a virtual pupil instead to the actual pupil. The principal ray angle at the field plane would in this case be negative. Such a system is presented in WO 2004/010224. The disclosure of WO 2004/010224 is hereby incorporated by reference in its entirety.

Figure 14:
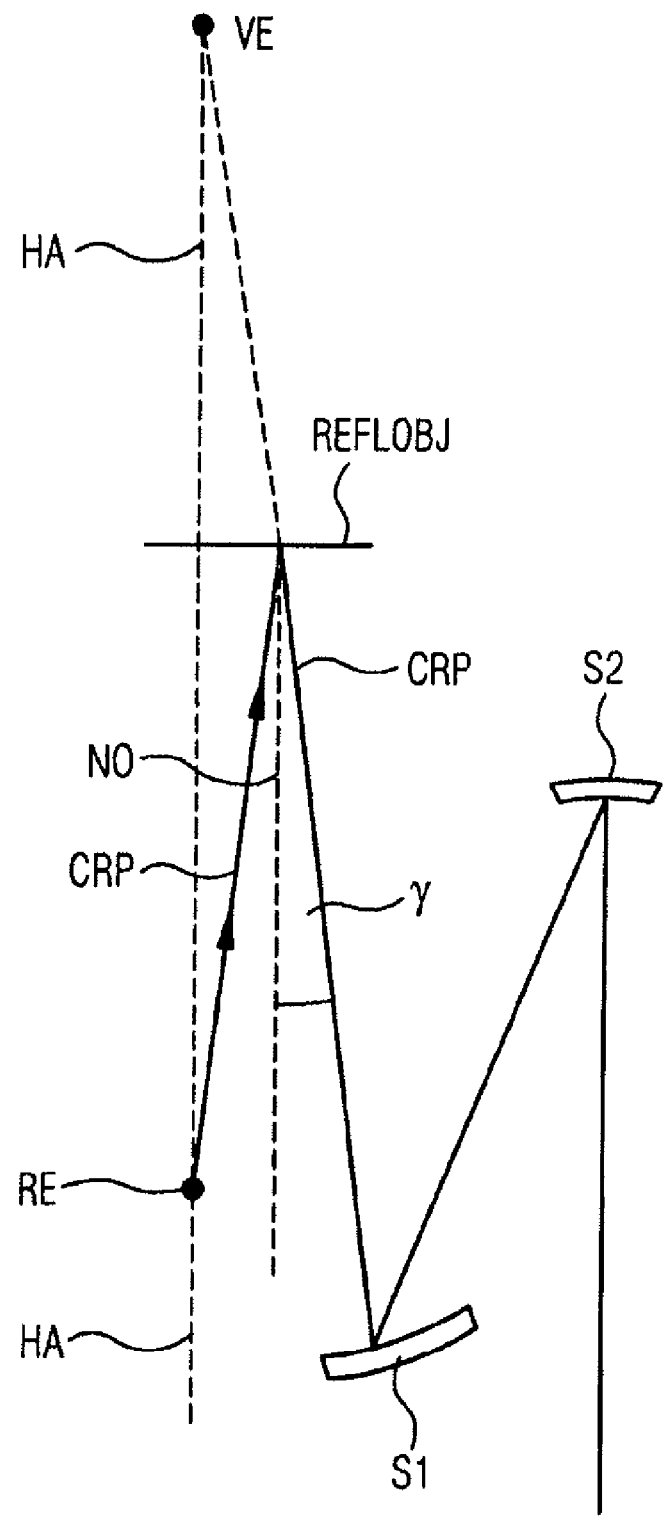
FIG. 14 illustrates the concepts of positive and negative back focus.

The entry back focus is negative in reflective systems with a so-called virtual entry pupil. FIG. 14 graphically illustrates the concept of a negative back focus.

FIG. 14 shows the principal ray CRB of an illumination light bundle to the central field point of an illuminated field as shown for example in FIG. 2 or FIG. 4. As shown here, the principal ray CRB of the illumination light bundle is reflected on a reflective object REFLOBJ, for example a reticle, and enters as the principal ray CRP of a projection light bundle into a projection objective, of which the first mirror S1 and the second mirror S2 are shown. The concept of negative back focus means that the principal ray CRB or CRP intersects the optical axis of the projection objective in the light path ahead of the reflective object, for example the reticle. In contrast to this, the point of intersection in systems with positive back focus lies in the light path after the reflective object REFLOBJ.

The term "back focus of the entry pupil" as used herein means the distance of the point of intersection of the optical axis HA of the projection objective with the principal ray CRB to the central field point in the object plane. In a system with negative back focus of the entry pupil, the entry pupil VE, which could also be called the virtual entry pupil VE, is mirrored into a mirrored entry pupil RE at the object plane. The mirrored entry pupil RE is formed in the light path from the light source to the image plane ahead of the reflective object REFLOBJ.

In systems with positive back focus of the entry pupil as shown in FIGS. 8 to 13, the entry pupil will lie, in the light path from the object plane to the image plane, in a position after the reflective object REFLOBJ in the object plane. In systems with negative back focus, the mirrored entry pupil RE will lie, in the light path from the light source to a reflected object, in a position ahead of the entry pupil.

Furthermore, in a system with a negative back focus the chief rays of the light bundles reflected at the reflective object run divergently with respect to the optical axis of the projection objective.

A system with a positive back focus is a system in which the chief rays of the light bundles reflected at the reflective object REFLOBJ run convergently with respect to the optical axis.

Figure 15:
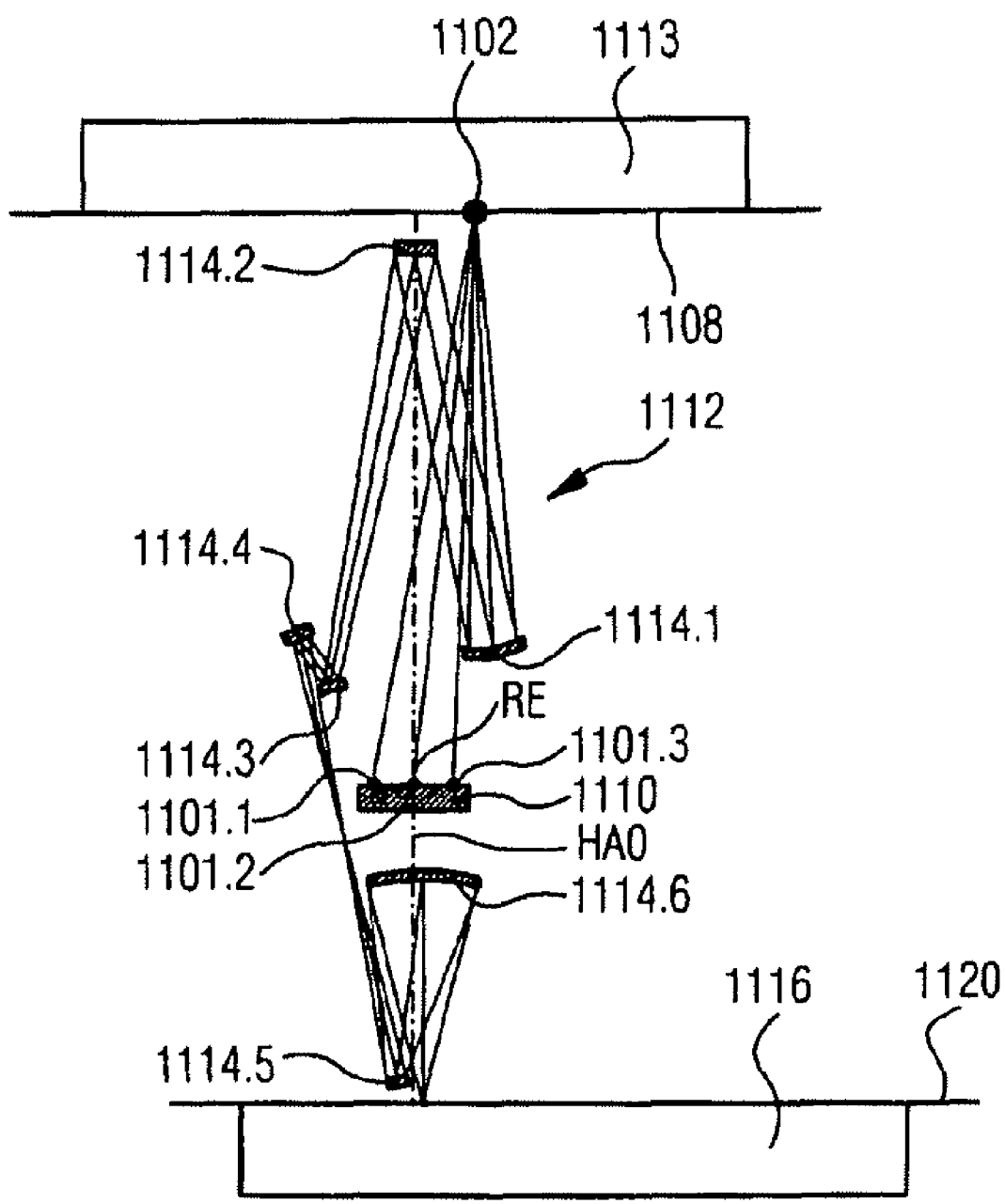
FIG. 15 illustrates a projection exposure apparatus with negative back focus and with no optical element in the light path from the optical element with multiple light sources to the field plane.

The system shown in FIG. 15 is similar to the system of FIG. 9, but with a negative back focus. The optical element with multiple light sources is identified with the reference symbol 1100. The optical element with multiple light sources is for example a multi-source array wherein each primary light source is projected by an associated collector substantially into the field plane 1108. The multi-source array 1100 in the present example is located substantially in the plane in which the mirrored entry pupil RE of the projection objective lies. Components that are identical to those in FIG. 9 are identified by the same reference symbols raised by 1000. Thus, the reference symbol 1120 belongs to the plane into which an image of an object in the field plane is projected, for example a reticle. The reference symbol 1112 belongs to the projection objective with negative back focus which contains in its light path from the field plane 1108 to the image plane 1116 a first mirror 1114.1, a second mirror 1114.2, a third mirror 1114.3, a fourth mirror 1114.4, a fifth mirror 1114.5, and a sixth mirror 1114.6. The primary light sources of the multi-source array are identified as 1101.1, 1101.2, and 1101.3.

However, it is also conceivable to place the optical element with multiple light sources 1100 at another location, in which case the images of the primary light sources are no longer projected essentially into the field plane as illustrated in FIG.

15, but into an intermediate image plane, which can lie for example upstream of the field plane 1108. The field plane 1108 will in this case show so-called defocused images of the primary light sources, which are also called illumination spots. As in the embodiment according to FIG. 9, there is no further optical element arranged between the optical element 1100 with multiple light sources and the field plane 1108, i.e. the light of the primary light sources of the optical elements 1100 with a multiple of light sources after reflection at the collectors associated with each of the primary light sources of the optical element 1100, is guided directly into the field plane.

Figure 16:
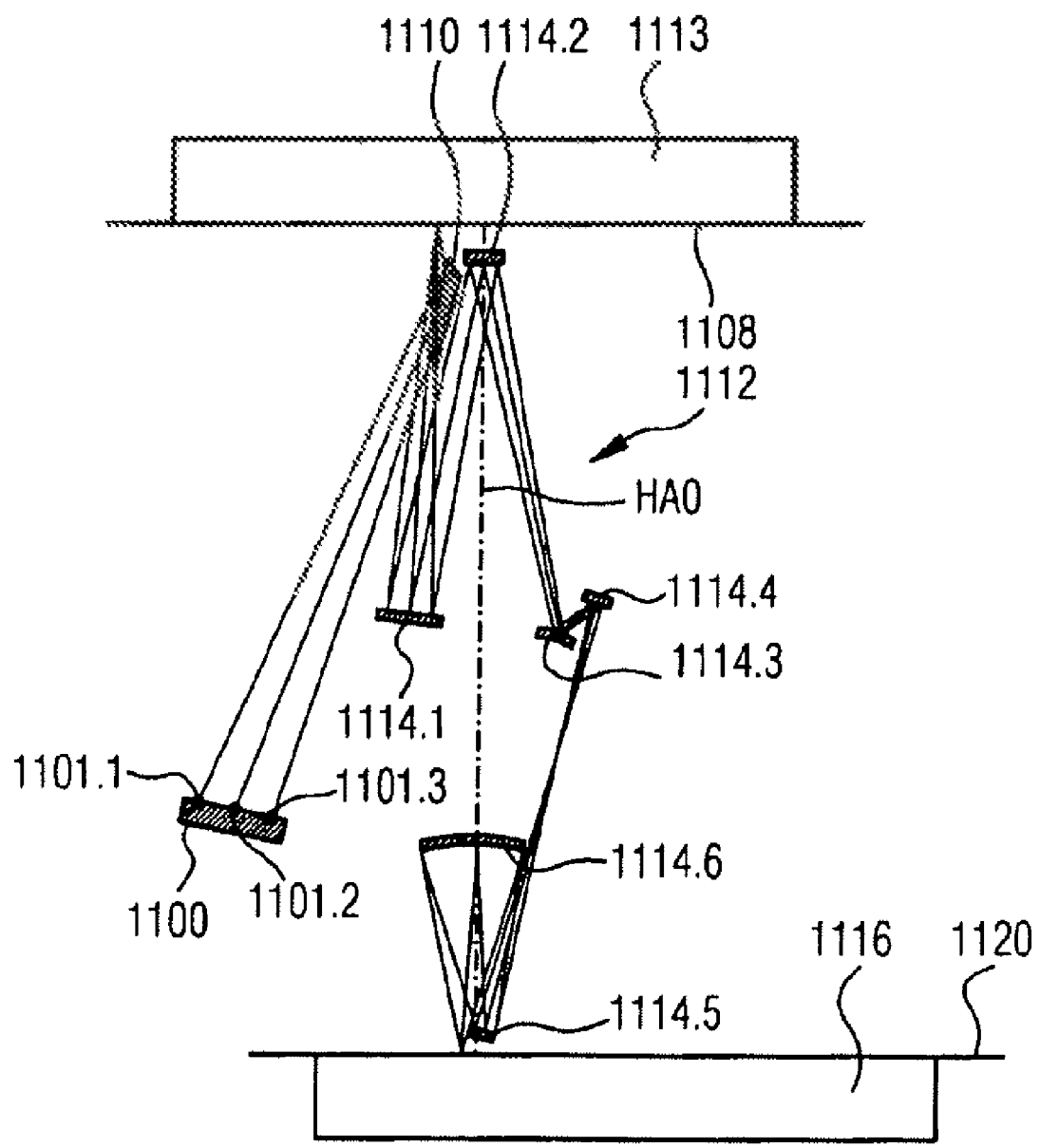
FIG. 16 illustrates a projection exposure apparatus with negative back focus and with a grazing-incidence mirror as the only optical element in the light path from the optical element with multiple light sources to the field plane.

FIG. 16 shows a further embodiment of a projection exposure apparatus with negative back focus and a multi-source array. The system is of the type which in addition contains a mirror 1110 in the light path from the multi-source array 1100 to the field plane 1108. This mirror 1110 is a grazing-incidence mirror, which serves to redirect the light path between the multi-source array 1100 and the field plane 1108. This is advantageous in regard to desired space properties. The redirecting mirror 1110 can be configured as a planar mirror, in which case the mirror has no influence on the projected image. As an alternative, the mirror can also be designed with optical power. As a possible example, the field mirror could have a toroidal surface and serve to shape the field in the field plane. An arrangement of this kind would have the advantage that the distribution of the individual light sources on the multi-source array can conform to a regular pattern, for example in rows and columns. The ring-shaped illumination in the field plane is shaped in this case substantially by the mirror 1110 which has optical power.

Figure 17:
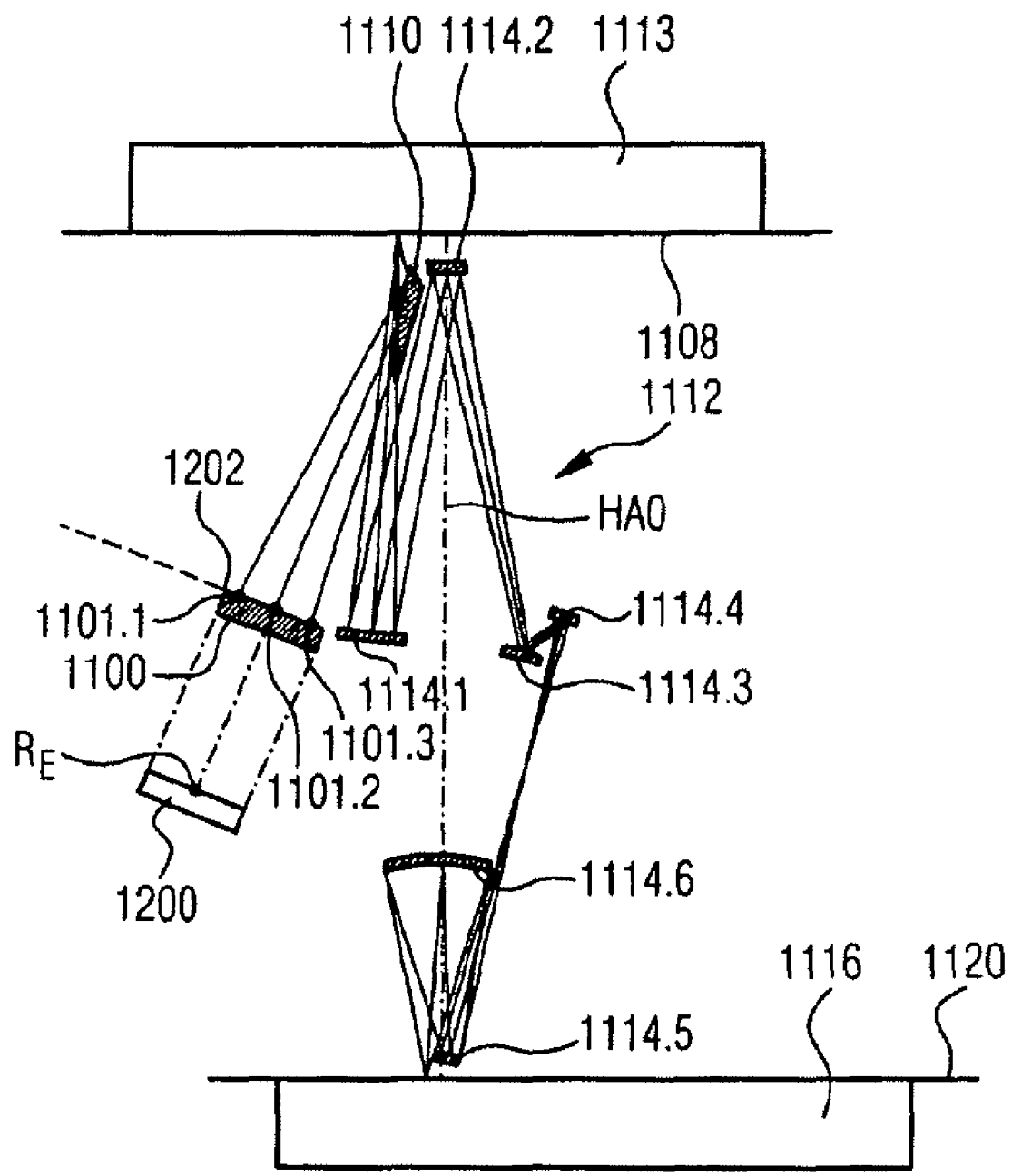
FIG. 17 illustrates a projection exposure apparatus with negative back focus and with a grazing-incidence mirror as the only optical element in the light path from the optical element with multiple light sources to the field plane, wherein the optical element with multiple light sources is arranged in an intermediate image plane that is neither a pupil plane nor a field plane nor a conjugate plane relative to the pupil plane, nor a conjugate plane relative to the field plane.

FIG. 17 shows a projection exposure apparatus with a similar design concept as shown in FIG. 16. FIG. 17 further shows the entry pupil RE which is mirrored at the field plane 1108, and it shows the plane 1200 in which the mirrored entry pupil is located. As can be seen in FIG. 17, the optical element 1100 with multiple light sources is arranged in the light path downstream of the plane 1200 in which the mirrored entry pupil is located. The optical element 1100 with multiple light sources is situated neither in a field plane nor in a pupil plane. Accordingly, the field plane is illuminated with illumination spots, meaning that the images of the light source are defocused. There is again a redirecting mirror 1110 arranged in the light path from the multi-source array to the field plane, which can again be configured as a purely planar mirror or as a mirror with optical power, as described in the context of FIG. 16.

The following is a description of a concrete example of an embodiment of an optical element with multiple light sources.

With the desired properties for a telecentricity of 1 mrad and for an entry-pupil back focus (which is defined as the length of the energy-weighted central ray between the field plane and the exit pupil) of about one meter, one finds an ideal distance of less than 2 mm between the light source images in the field plane 108. With a distance of less than 2 mm, the telecentricity error in the exit pupil with a point in the field of the field plane 108 between two selected target points is less than 1 mrad.

If the light source images of the primary light sources are made larger by design, the field points between the target points will always receive light from the pupil directed to at least two target points. The desired telecentricity property in this case is also met with fewer target points, for example with 30 target points. FIGS. 18A and 18B show, respectively, an optical element with round light sources and an enlarged detail portion of the optical element.

As an example, FIG. 18A shows the optical element with multiple primary light sources with approximately round primary light sources 130. The reference symbol 132 indicates a detail portion of the optical element with multiple primary light sources. As FIG. 18B shows, the entire optical element consists of a large number of primary light sources with at least 30 light sources being assigned to one field point. If one assumes a number of more than 50 points for the pupil, the optical element will need about 2000 to 5000 primary light sources.

What is claimed is:

1. An illumination system, comprising:
  an optical element comprising a plurality of primary light sources and a plurality of reflective surfaces,
  wherein the illumination system is configured so that during use of the illumination system:
    the illumination system illuminates an area in a field plane;
    each of the plurality of primary light sources illuminates a portion of the area in the field plane that is smaller than the area;
    the plurality of reflective surfaces receive light from one or more of the plurality of primary light sources;
    the plurality of primary light sources and the plurality of reflective surfaces are positionable relative to each other so that a plurality of light bundles originating from the multiple primary light sources are emitted in different directions; and
    the plurality of primary light sources and the plurality of reflective surfaces are adjustable in their positions relative to each other by shifting and/or tilting individual primary light sources relative to respective reflective surfaces.

2. The illumination system according to claim 1, wherein the optical element is arranged in a light source array.

3. The illumination system according to claim 1, wherein at least one of the plurality of reflective surfaces is assigned to each of the plurality primary light sources.

4. The illumination system according to claim 1, wherein the plurality of primary light sources and the reflective surfaces are adjustable in their positions relative to each other by shifting and/or tilting the reflective surfaces relative to respective individual primary light sources.

5. The illumination system according to claim 1, wherein the plurality of reflective surfaces are elements of grazing-incidence collectors.

6. The illumination system according to claim 1, wherein the plurality of reflective surfaces are elements of normal-incidence collectors.

7. The illumination system according to claim 1, wherein the illumination system comprises a plurality of light source units, each light source unit comprises one of the plurality of primary light sources and one of the plurality of reflective surfaces, and the individual light source units are shiftable and/or tiltable relative to each other so that the light bundles associated with the different light source units are emitted in different directions.

8. The illumination system according to claim 1, wherein at least one reflective surface has positive optical power selected so that a plurality of images of a respective primary light source are produced in the field plane.

9. The illumination system according to claim 1, wherein:
  the illumination system has an exit pupil;
  the illumination system is configured so that during use of the illumination system the plurality of primary light sources illuminate an area in the exit pupil; and
  the area is encircled by an exit pupil contour.

10. The illumination system according to claim 9, wherein at least some of the plurality of primary light sources are capable of being switched on and off so that different exit pupil contours can be generated by selectively switching specific primary light sources on and off.

11. The illumination system according to claim 9, wherein the illumination system is configured so that during use of the illumination system:
- a first set of the plurality of primary light sources illuminates a first area in the exit pupil; and
- a second set of the plurality of primary light sources illuminates a second area in the exit pupil.

12. The illumination system according to claim 11, wherein the first area is encircled by an annular exit pupil contour, and the second area is encircled by a dipolar or quadrupolar exit pupil contour.

13. The illumination system according to claim 11, wherein:
- the optical element comprises reflective surfaces which receive light from one or more of the plurality of primary light sources; and
- the reflective surfaces are capable of being changed in their positions relative to the primary light sources so that areas encircled by different exit pupil contours are illuminated during use of the illumination system.

14. The illumination system according to claim 1, further comprising a concave mirror in a light path between the optical element and the field plane, wherein during use of the illumination system the concave mirror projects an image of the optical element into an exit pupil of the illumination system.

15. The illumination system according to claim 1, wherein the illumination system is configured to be used in a microlithography projection exposure apparatus.

16. A projection exposure apparatus, comprising:
- an illumination system according to claim 1; and
- a projection objective.

17. The projection exposure apparatus according to claim 16, wherein the projection exposure apparatus is a microlithography projection exposure apparatus.

18. The illumination system of claim 1, wherein the illumination system is configured so that during use of the illumination system each of the plurality of primary light sources illuminates a portion of the area in the field plane that is less than $\frac{1}{10}$ of a size of the area.

19. The illumination system of claim 1, wherein the illumination system is configured so that during use of the illumination system each of the plurality of primary light sources illuminates a portion of the area in the field plane that is less than $\frac{1}{50}$ of a size of the area.

20. The illumination system of claim 1, wherein the illumination system is configured so that during use of the illumination system each of the plurality of primary light sources illuminates a portion of the area in the field plane that is less than $\frac{1}{100}$ of a size of the area.

21. The illumination system of claim 1, wherein the illumination system is configured so that during use of the illumination system each of the plurality of primary light sources illuminates a portion of the area in the field plane that is less than $\frac{1}{1000}$ of a size of the area.

* * * * *

UNITED STATES PATENT AND TRADEMARK OFFICE
CERTIFICATE OF CORRECTION

PATENT NO. : 8,253,927 B2
APPLICATION NO. : 12/470092
DATED : August 28, 2012
INVENTOR(S) : Udo Dinger It is certified that error appears in the above-identified patent and that said Letters Patent is hereby corrected as shown below:

Column 3,
Line 11, delete "collectors. assigned" and insert --"collectors assigned"--

Column 3,
Line 15, delete "telecenthcity" and insert --telecentricity--

Column 10,
Line 30, delete "form" and insert --from--

Column 20,
Line 38, claim 3, delete "plurality" and insert --plurality of--

Signed and Sealed this
Twentieth Day of November, 2012

David J. Kappos
*Director of the United States Patent and Trademark Office*